(12) United States Patent
Yang et al.

(10) Patent No.: US 11,735,513 B2
(45) Date of Patent: Aug. 22, 2023

(54) INTEGRATED CHIP HAVING A BACK-SIDE POWER RAIL

(71) Applicant: Taiwan Semiconductor Manufacturing Company, Ltd., Hsinchu (TW)

(72) Inventors: Shin-Yi Yang, New Taipei (TW); Ming-Han Lee, Taipei (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 76 days.

(21) Appl. No.: 17/394,622

(22) Filed: Aug. 5, 2021

(65) Prior Publication Data

US 2023/0042548 A1 Feb. 9, 2023

(51) Int. Cl.
*H01L 23/50* (2006.01)
*H01L 23/528* (2006.01)
*H01L 21/8234* (2006.01)
*H01L 27/088* (2006.01)
*H01L 23/522* (2006.01)

(52) U.S. Cl.
CPC ...... *H01L 23/50* (2013.01); *H01L 21/823475* (2013.01); *H01L 23/5226* (2013.01); *H01L 23/5286* (2013.01); *H01L 27/088* (2013.01)

(58) Field of Classification Search
CPC ............. H01L 23/50; H01L 21/823475; H01L 23/5226; H01L 23/5286; H01L 27/088; H01L 21/28518; H01L 21/76804; H01L 21/76831; H01L 21/76897
See application file for complete search history.

(56) References Cited

U.S. PATENT DOCUMENTS

| | | | |
|---|---|---|---|
| 2020/0105671 A1* | 4/2020 | Lai | G06F 30/39 |
| 2020/0135634 A1* | 4/2020 | Chiang | H01L 29/4175 |
| 2022/0085013 A1* | 3/2022 | Reznicek | H01L 29/66742 |
| 2022/0093594 A1* | 3/2022 | Song | H01L 29/7851 |
| 2022/0301878 A1* | 9/2022 | Xie | H01L 21/30625 |
| 2022/0406715 A1* | 12/2022 | Xie | H01L 29/66553 |

* cited by examiner

*Primary Examiner* — Karen Kusumakar
*Assistant Examiner* — Adam S Bowen
(74) *Attorney, Agent, or Firm* — Eschweiler & Potashnik, LLC

(57) ABSTRACT

The present disclosure relates to an integrated chip including a semiconductor device. The semiconductor device includes a first source/drain structure, a second source/drain structure, a stack of channel structures, and a gate structure. The stack of channel structures and the gate structure are between the first and second source/drain structures. The gate structure surrounds the stack of channel structures. A first conductive wire overlies and is spaced from the semiconductor device. The first conductive wire includes a first stack of conductive layers. A first conductive contact extends through a dielectric layer from the first conductive wire to the first source/drain structure. The first conductive contact is on a back-side of the first source/drain structure.

20 Claims, 24 Drawing Sheets

INTEGRATED CHIP HAVING A BACK-SIDE POWER RAIL

BACKGROUND

Modern day integrated chips contain millions of semiconductor devices. The semiconductor devices are electrically interconnected by way of metal interconnect layers that are formed above and/or below the devices on an integrated chip. A typical integrated chip comprises a plurality of metal interconnect layers including different sized metal wires vertically coupled together with metal vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
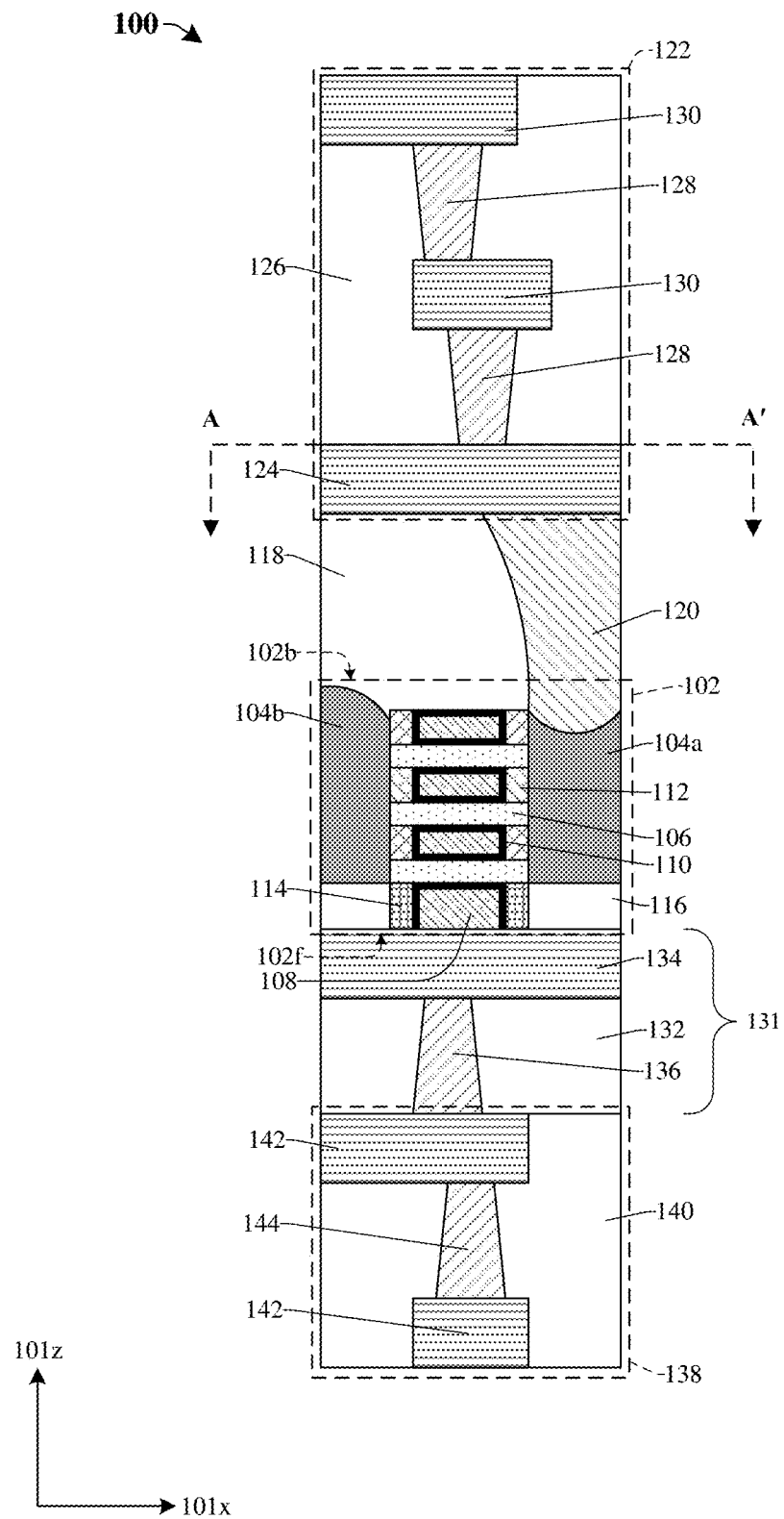
FIG. 1 illustrates a cross-sectional view of some embodiments of an integrated chip comprising a source/drain contact that is on a back-side of a semiconductor device and further comprising a first wire that comprises a stack of conductive monolayers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes a semiconductor device along a substrate. The semiconductor device comprises a gate structure between a first source/drain structure and a second source/drain structure. The semiconductor device further comprises a channel structure within the gate structure that extends between the first source/drain structure and the second source/drain structure. A metal source/drain contact extends through a dielectric layer to a front-side of the first source/drain structure. A first metal wire is on the metal source/drain contact. The first metal wire is arranged within a dielectric structure. Further, the first metal wire may, for example, comprise copper or some other suitable metal. An interconnect structure is over the first metal wire.

A challenge with the integrated chip is that the metal source/drain contact and/or the first metal wire may have small dimensions (e.g., widths and/or lengths) because the integrated chip may have a high routing density on the front-side of the semiconductor device and hence there may be limited space for the metal source/drain contact and/or the first metal wire. Because the metal source/drain contact and/or the first metal wire have small dimensions, a voltage drop (e.g., IR drop) of the integrated chip may be high.

Another challenge with the integrated chip is that the first metal wire may have a high resistance. For example, the first metal wire may have a high resistance when copper because of the high resistivity of copper (e.g., about 17 µΩ×mm). Because the first metal wire has a high resistance, a resistance-capacitance (RC) delay of the integrated chip may be high.

Further, the first metal wire may have low reliability. For example, the first metal wire may have a low current density at which electromigration may occur when copper (e.g., about $10^6$ A/cm$^2$). Thus, the likelihood of electromigration may be high and hence the reliability of the first metal wire may be low. The low reliability of the first metal wire may diminish a time-dependent dielectric breakdown (TDDB) of the dielectric structure.

Furthermore, a capacitance of the first metal wire may be high. For example, the first metal wire may have a large thickness and hence a surface area of a sidewall of the first metal wire may be large, thereby resulting in the first metal wire having a high capacitance with neighboring metal wires. Thus, the RC delay of the integrated chip may be further increased.

Various embodiments of the present disclosure are related to an integrated chip including a source/drain contact on a back-side of a semiconductor device and including a first wire that is on the source/drain contact and that comprises a first stack of conductive monolayers for improving a performance of the integrated chip. The semiconductor device comprises a gate structure laterally between a first source/drain structure and a second source/drain structure. A channel structure is within the gate structure and extends laterally between the first source/drain structure and the second source/drain structure. The source/drain contact is on a back-side of the first source/drain structure and extends through a dielectric layer to a back-side surface of the first source/drain structure. The first wire is on the source/drain contact. The first wire comprises the first stack of conductive monolayers.

In some embodiments, the source/drain contact may have large dimensions (e.g., width and/or length) because the integrated chip may have a low routing density on the back-side of the semiconductor device and hence there may be ample space for the source/drain contact to have such large dimensions. Because the source/drain contact has large dimensions, a voltage drop (e.g., IR drop) of the source/drain contact may be low.

In some embodiments, the first stack of conductive monolayers comprises a graphene stack, a stack of transition metal dichalcogenides, or some other stack of two-dimensional materials. Because the aforementioned two-dimensional materials have low resistivities (e.g., about 10 µΩ×mm or some other suitable value when graphene), a resistance of the first wire may be low. Thus, an RC delay of the integrated chip may be low.

Further, because the aforementioned two-dimensional materials have high current densities at which electromigration may occur (e.g., about $10^8$ A/cm$^2$ or some other suitable value when graphene), the likelihood of the first wire experiencing electromigration may be low. Thus, a reliability of the first wire may be high. The high reliability of the first wire may enhance a TDDB of the dielectric layer.

Furthermore, in some embodiments, the first wire has a small thickness (e.g., about 3 to 500 angstroms or some other suitable value). Because the first wire has a small thickness, a surface area of a sidewall of the first wire may be small, thereby resulting in the first wire having a low capacitance with neighboring wires. Thus, the RC delay of the integrated chip may be further reduced.

Figure 2:
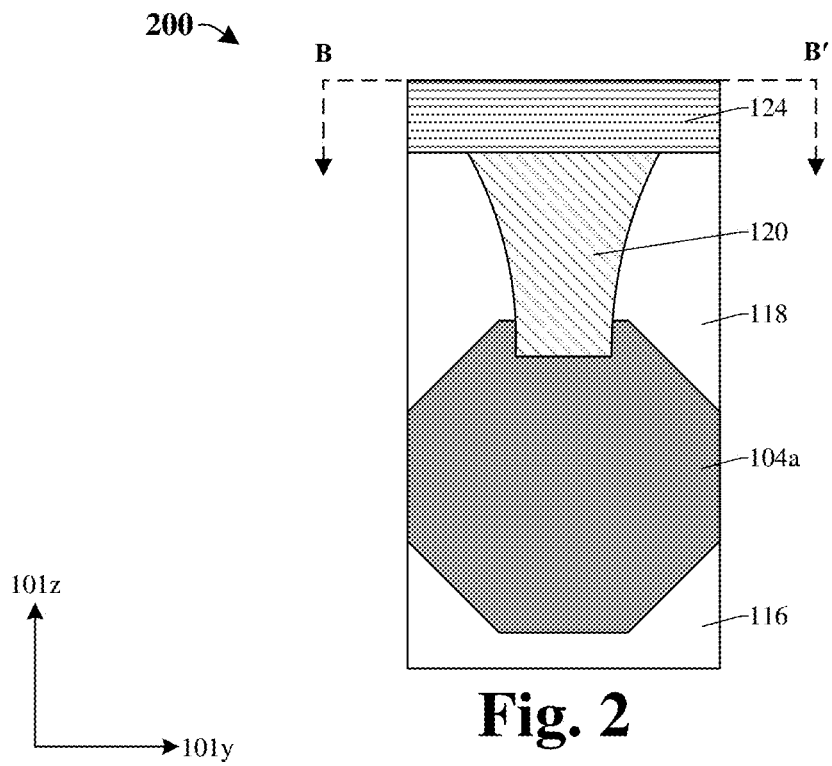
FIG. 2 illustrates another cross-sectional view of some embodiments of the integrated chip of FIG. 1.
Figure 3:
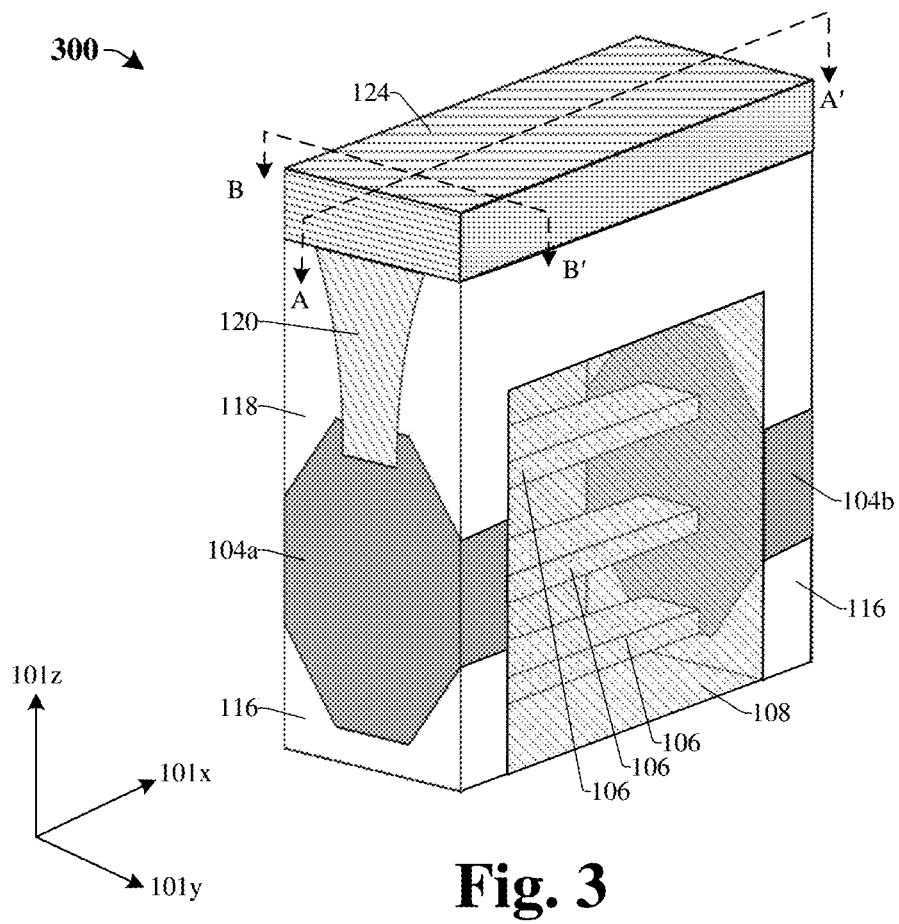
FIG. 3 illustrates a three-dimensional view of some embodiments of the integrated chip of FIG. 1.

Referring to FIGS. 1, 2, and 3 simultaneously: FIG. 1 illustrates a cross-sectional view 100 of some embodiments of an integrated chip comprising a source/drain contact 120 that is on a back-side 102b of a semiconductor device 102 and further comprising a first wire 124 that comprises a stack of conductive monolayers; FIG. 2 illustrates another cross-sectional view 200 of some embodiments of the integrated chip of FIG. 1; and FIG. 3 illustrates a three-dimensional view 300 of some embodiments of the integrated chip of FIG. 1. In some embodiments, the cross-sectional view 100 of FIG. 1 may, for example, be taken across line A-A' of FIG. 3, and the cross-sectional view 200 of FIG. 2 may, for example, be taken across line B-B' of FIG. 3.

The integrated chip comprises the semiconductor device 102. The semiconductor device 102 comprises a first source/drain structure 104a and a second source/drain structure 104b adjacent to the first source/drain structure 104a. A gate structure 108 (e.g., a gate electrode) is between the first source/drain structure 104a and the second source/drain structure 104b. A stack of channel structures 106 extends laterally between the first source/drain structure 104a and the second source/drain structure 104b. The stack of channel structures 106 is arranged within the gate structure 108 (e.g., the stack of channel structures 106 extends through the gate structure 108). In other words, the gate structure 108 extends in a closed path to surround the stack of channel structures 106. A gate dielectric layer 110 lines the stack of channel structures 106 and separates the stack of channel structures 106 from the gate structure 108. A plurality of inner spacers 112 laterally separate the gate structure 108 from the first source/drain structure 104a and the second source/drain structure 104b.

In some embodiments, a first front-side dielectric layer 116 extends along a front-side 102f of the semiconductor device 102. Gate spacers 114 laterally separate the gate structure 108 from the first front-side dielectric layer 116.

In some embodiments, a middle-of-line (MOL) interconnect structure 131 extends along the front-side 102f of the semiconductor device 102. The MOL interconnect structure 131 may, for example, comprise a MOL wire 134, a MOL via 136, and a MOL dielectric structure 132. In some embodiments, the MOL wire 134 extends below the gate structure 108 and along the front-side 102f of the semiconductor device 102. In some embodiments, the MOL wire 134 is on a bottom surface of the gate structure 108.

In some embodiments, a front-side interconnect structure 138 extends along the front-side 102f of the semiconductor device 102 and along the MOL interconnect structure 131. The front-side interconnect structure 138 may, for example, comprise a front-side dielectric structure 140, one or more front-side wires 142, and one or more front-side vias 144.

A first back-side dielectric layer 118 extends along a back-side 102b of the semiconductor device 102. The source/drain contact 120 extends through the first back-side dielectric layer 118 to a back-side of the first source/drain structure 104a (e.g., to a top surface of the first source/drain structure 104a). The source/drain contact 120 is electrically coupled to the first source/drain structure 104a. In some embodiments, the source/drain contact 120 is in direct contact with the first source/drain structure 104a. In some embodiments, the source/drain contact 120 may be referred to as a power rail.

The first wire 124 extends along first back-side dielectric layer 118 and is arranged on the source/drain contact 120. The first wire 124 comprises a first stack of conductive layers. In some embodiments, the first stack of conductive layers comprises a first stack of two-dimensional material(s) such as, for example, graphene, some intercalated graphene (e.g., graphene intercalated with one or more metals or with some other suitable material), some transition metal dichalcogenide(s) (e.g., molybdenum disulfide ($MoS_2$), molybdenum diselenide ($MoSe_2$), molybdenum ditelluride ($MoTe_2$), tantalum sulfide ($TaS_2$), tantalum selenide ($TaSe_2$), tantalum ditelluride ($TaTe_2$), tungsten disulfide ($WS_2$), tungsten diselenide ($WSe_2$), tungsten ditelluride ($WTe_2$), or the like), or some other suitable two-dimensional materials. In other words, the first wire 124 comprises a first stack of conductive monolayers.

In some embodiments, the first wire 124 is in direct contact with the source/drain contact 120 (e.g., the first stack of two-dimensional material(s) is in direct contact with the source/drain contact 120). In some embodiments, the first wire 124 extends laterally beyond outer sidewalls of the first source/drain structure 104a and the second source/drain structure 104b.

In some embodiments, a back-side interconnect structure 122 is over the first wire 124 and extends along the back-side 102b of the semiconductor device 102. In some embodiments, the back-side interconnect structure 122 may, for example, comprise one or more back-side vias 128 and/or one or more back-side wires 130 within a back-side dielectric structure 126. The back-side wires 130 include the first wire 124, such that the first wire 124 may be regarded as a back-side wire.

In some embodiments, because the aforementioned two-dimensional material(s) have low resistivities (e.g., about 10 μΩ×mm or some other suitable value when graphene), a resistance of the first wire 124 may be low. Thus, an RC delay of the integrated chip may be low.

Further, because the aforementioned two-dimensional material(s) have high current densities at which electromigration may occur (e.g., about $10^8$ A/cm$^2$ or some other suitable value when graphene), the likelihood of the first wire 124 experiencing electromigration may be low. Thus, a reliability of the first wire 124 may be improved. The high reliability of the first wire 124 may enhance a time-dependent dielectric breakdown (TDDB) of the back-side dielectric structure 126.

In some embodiments, the source/drain contact 120 may have large dimensions such as, for example, a width (e.g., along a y-axis 101y) and/or a length (e.g., along an x-axis 101x) because the integrated chip may have a low routing density on the back-side 102b of the semiconductor device 102 and hence there may be ample space for the source/drain contact 120 to have such large dimensions. For example, a width of the source/drain contact 120 may, for example, be about less than about 600 angstroms or some other suitable value, and a length of the source/drain contact may, for example, be about less than 400 angstroms or some other suitable value. Because the source/drain contact 120 has large dimensions, a voltage drop (e.g., IR drop) of the source/drain contact 120 may be low.

In some embodiments, the first wire 124 has a small thickness (e.g., along a z-axis 101z) such as, for example, about 3 to 500 angstroms or some other suitable value. Because the first wire 124 has a small thickness, a surface area of a sidewall of the first wire 124 may be small, thereby resulting in the first wire 124 having a low capacitance with neighboring wires. Thus, the RC delay of the integrated chip may be further reduced.

In some embodiments, a bottom surface of the first source/drain structure 104a, opposite the top surface of the first source/drain structure 104a, and the bottom surface of the gate structure 108 face away from the first wire 124, and the bottom surface of the gate structure 108 is below the bottom surface of the first source/drain structure 104a. Further, in some embodiments, the source/drain contact 120 is on the top surface of the first source/drain structure 104a.

In some embodiments, the semiconductor device 102 may, for example, be or comprise a gate-all-around field-effect transistor (GAA FET), a fin field-effect transistor (Fin FET), or some other suitable semiconductor device.

In some embodiments, the first source/drain structure 104a and the second source/drain structure 104b may, for example, comprise doped silicon germanium, some other doped semiconductor, or some other suitable material.

In some embodiments, the stack of channel structures 106 may, for example, comprise silicon, some other semiconductor, or some other suitable material.

In some embodiments, the gate structure 108 may, for example, comprise copper, cobalt, nickel, ruthenium, iridium, aluminum, platinum, palladium, gold, silver, osmium, molybdenum, tungsten, some other metal, doped polysilicon, or some other suitable conductive material.

In some embodiments, the gate dielectric layer 110 may, for example, comprise aluminum oxide, aluminum nitride, hafnium oxide, hafnium nitride, some other metal-oxide, some other metal-nitride, silicon dioxide, silicon nitride, silicon carbide, silicon oxycarbide, silicon oxynitride, silicon oxycarbonitride, or some other suitable dielectric material.

In some embodiments, the inner spacers 112 and/or the gate spacers 114 may, for example, comprise silicon dioxide, silicon nitride, silicon carbide, silicon oxycarbide, silicon oxynitride, some Si—O—C—H dielectric, or some other suitable material.

In some embodiments, the first front-side dielectric layer 116, the first back-side dielectric layer 118, the MOL dielectric structure 132, the front-side dielectric structure 140, and/or the back-side dielectric structure 126 may, for example, comprise silicon dioxide, silicon nitride, silicon carbide, silicon oxycarbide, silicon oxynitride, some Si—O—C—H dielectric, or some other suitable material.

In some embodiments, the source/drain contact 120, the MOL vias 136, the back-side vias 128, and/or the front-side vias 144 may, for example, comprise copper, cobalt, nickel, ruthenium, iridium, aluminum, platinum, palladium, gold, silver, osmium, molybdenum, tungsten, some other metal, or some other suitable conductive material.

In some embodiments, the MOL wires 134, the back-side wires 130, and/or the front-side wires 142 may, for example, comprise stacks of conductive monolayers such as graphene, some intercalated graphene, some transition metal dichalcogenide(s), some other suitable two-dimensional material(s), copper, cobalt, nickel, ruthenium, iridium, aluminum, platinum, palladium, gold, silver, osmium, molybdenum, tungsten, some other metal, or some other suitable conductive material.

It should be noted that the gate dielectric layer 110, the inner spacers 112, the gate spacers 114 are not illustrated in FIG. 3 for the sake of simplicity and clarity. Further, it should be noted that the stack of channel structures 106 is elongated in FIG. 3 relative to FIG. 1 for the sake of clarity. Furthermore, it should be noted that the back-side interconnect structure 122, the MOL interconnect structure 131, and the front-side interconnect structure 138 are not illustrated in FIGS. 2 and 3 for the sake of simplicity and clarity.

Although items 120, 124, 128, 130, 134, 136, 142, and 144 are referred to as contacts, rails, vias, wires, and the like, it will be appreciated that in some embodiments, those items may alternatively be generically referred to as conductive interconnects. For example, in some embodiments, the source/drain contact 120 may be alternatively referred to as a first conductive interconnect, the first wire 124 may alternatively be referred to as a second conductive interconnect, and so on.

Figure 4A:
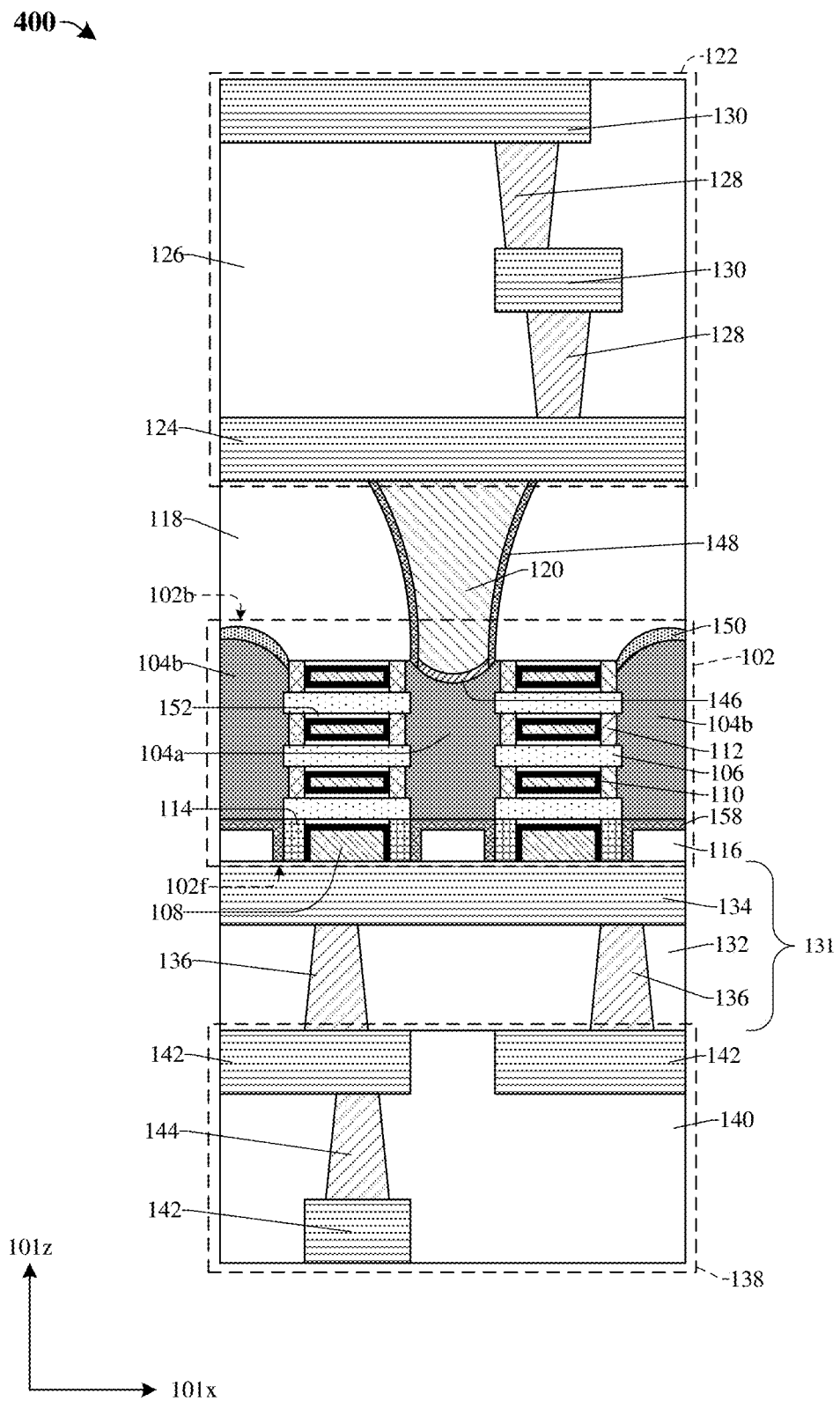
FIG. 4A illustrates a cross-sectional view of some alternative embodiments of the integrated chip of FIG. 1 in which the integrated chip comprises a common source/drain structure between a pair of individual source/drain structures.

FIG. 4A illustrates a cross-sectional view 400 of some alternative embodiments of the integrated chip of FIG. 1 in which the integrated chip comprises a common source/drain structure 104a between a pair of individual source/drain structures 104b.

In such embodiments, a pair of stacks of channel structures 106 respectively extend between the common source/drain structure 104a and the individual source/drain structures 104b on opposing sides of the common source/drain structure 104a (e.g., a first stack of channel structures extends between the common source/drain structure 104a and a first individual source/drain structure, and a second stack of channel structures extends between the common source/drain structure 104a and a second individual source/drain structure). The pair of stacks of channel structures 106 are respectively surrounded by a pair of gate structures 108 (e.g., the pair of stacks of channel structures 106 are respectively within the pair of gate structures 108).

The source/drain contact 120 extends to a top surface of the common source/drain structure 104a. In some embodiments, a layer of silicide 146 is between the source/drain contact 120 and the common source/drain structure 104a. In some embodiments, the layer of silicide 146 vertically separates the source/drain contact 120 from the common source/drain structure 104a.

In some embodiments, a dielectric liner layer 148 extends along sidewalls of the source/drain contact 120. In some embodiments, the dielectric liner layer 148 laterally separates the source/drain contact 120 from the first back-side dielectric layer 118.

In some embodiments, an undoped semiconductor layer 150 extends along the backsides of the pair of individual source/drain structures 104b. In some embodiments, an interfacial layer 152 surrounds the pair of stacks of channel structures 106 and the gate dielectric layer 110 surrounds the interfacial layer 152.

In some embodiments, a front-side etch-stop layer 158 extends along the front-side 102f of the semiconductor device 102. In some embodiments, the front-side etch-stop layer 158 extends between the pair of individual source/drain structures 104b and the first front-side dielectric layer 116. In some embodiments, the front-side etch-stop layer 158 extends between the common source/drain structure 104a and the first front-side dielectric layer 116. In some embodiments, the front-side etch-stop layer 158 extends between the gate spacers 114 and the first front-side dielectric layer 116.

Figure 4B:
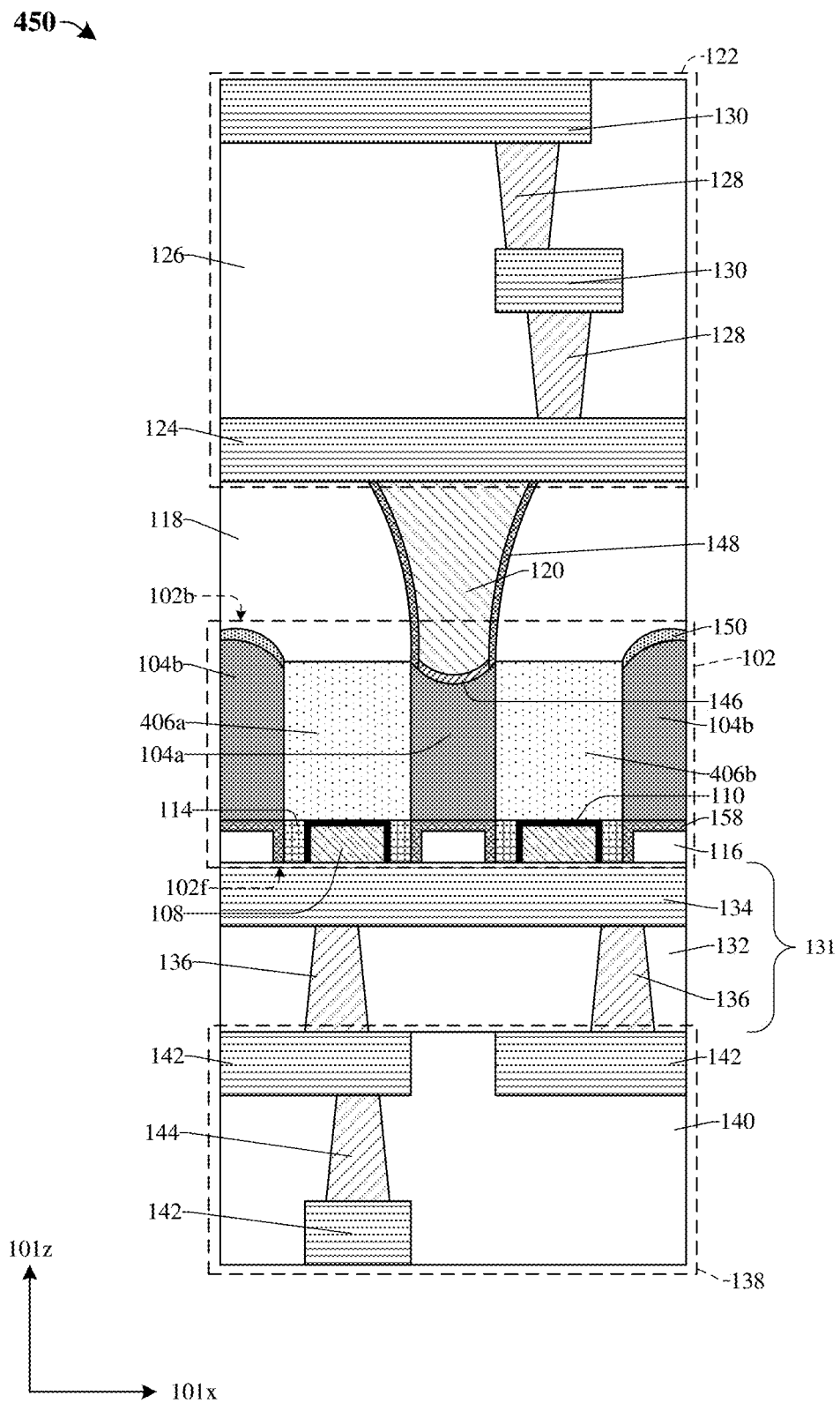
FIG. 4B illustrates a cross-sectional view of some alternative embodiments of the integrated chip of FIG. 4A in which the integrated chip comprises a first channel structure and a second channel structure.

FIG. 4B illustrates a cross-sectional view 450 of some alternative embodiments of the integrated chip of FIG. 4A in which the integrated chip comprises a first channel structure 406a and a second channel structure 406b.

In such embodiments, the first channel structure 406a and the second channel structure 406b both extend continuously from along a top of the common source/drain region 104a to along a bottom of the common source/drain region 104a on opposing sides of the common source/drain region 104a. For example, in some embodiments, the first channel structure 406a and the second channel structure 406b are fin-shaped. Hence, in such embodiments, the semiconductor device 102 may, for example, be or comprise a Fin FET device or the like.

Figure 5A:
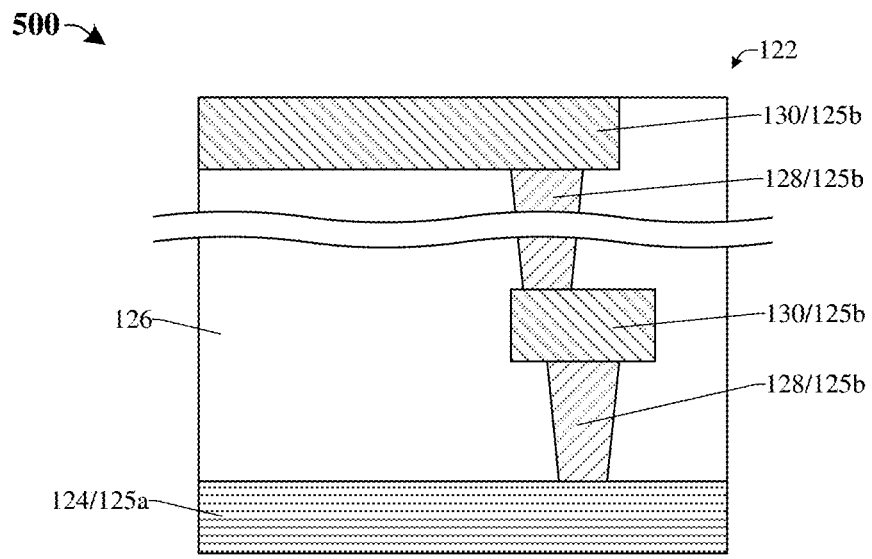
FIGS. 5A and 5B illustrate cross-sectional views of some embodiments of a back-side interconnect structure of FIG. 1.

FIG. 5A illustrates a cross-sectional view 500 of some embodiments of the back-side interconnect structure 122 of FIG. 1.

In such embodiments, the first wire 124 comprises a stack of one or more two-dimensional materials 125a while the back-side vias 128 and the back-side wires 130 consist of one or more metal layers 125b and are devoid of two-dimensional materials.

Figure 5B:
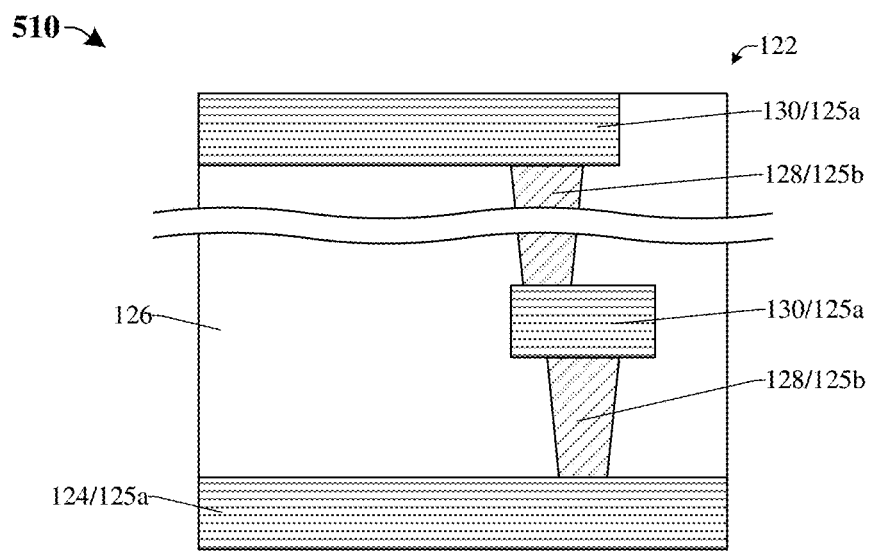

FIG. 5B illustrates a cross-sectional view 510 of some alternative embodiments of the back-side interconnect structure 122 of FIG. 5A.

In such embodiments, the first wire 124 and the back-side wires 130 comprise stacks of one or more two-dimensional materials 125a while the back-side vias 128 consist of one or more metal layers 125b and are devoid of two-dimensional materials.

By controlling which back-side interconnect(s) (e.g. 124, 130, etc.) comprise which material(s) (e.g., one or more metals, one or more two-dimensional materials, or the like), control over the performance characteristics (e.g., resistances or some other characteristic(s)) of the back-side interconnect may be improved, thereby improving a performance of the integrated chip.

Figure 6A:
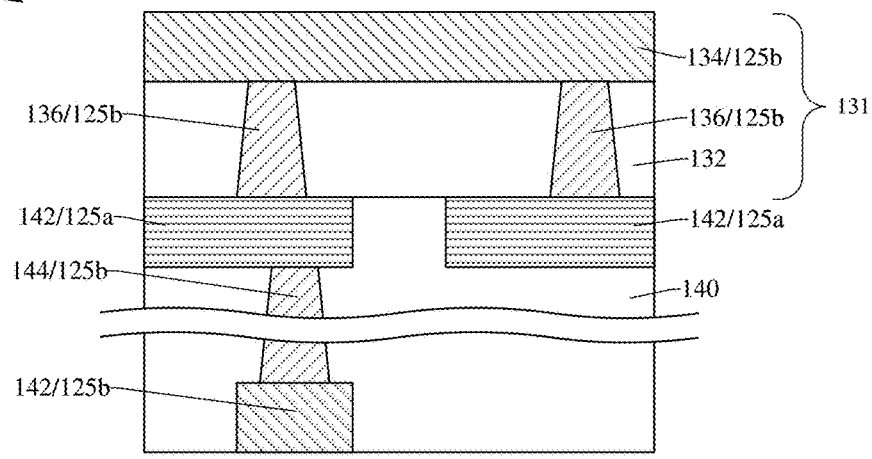
FIGS. 6A-6C illustrate cross-sectional views of some embodiments of a front-side interconnect structure of FIG. 1.

FIG. 6A illustrates a cross-sectional view 600 of some embodiments of the front-side interconnect structure 138 of FIG. 1.

In such embodiments, only some of the front-side wires 142 (e.g., the front-side wires closest to the MOL interconnect structure 131, sometimes referred to as the metal-zero layer) comprise stacks of one or more two-dimensional materials 125a while the other front-side wires 142 (e.g., at a metal-one layer, a metal-two layer, etc.), the front-side vias 144, the MOL wires 134, and the MOL vias 136 consist of one or more metal layers 125b and are devoid of two-dimensional materials.

Figure 6B:
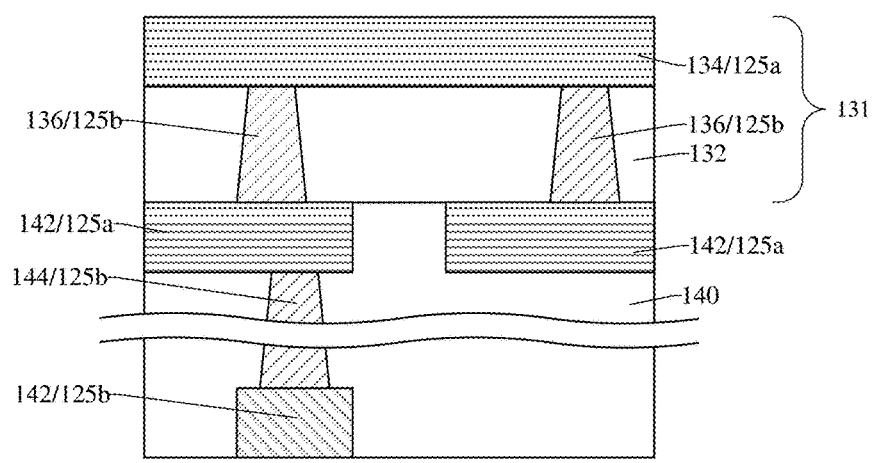

FIG. 6B illustrates a cross-sectional view 610 of some alternative embodiments of the front-side interconnect structure 138 of FIG. 6A.

In such embodiments, only some of the front-side wires 142 (e.g., the front-side wires closest to the MOL interconnect structure 131, sometimes referred to as the metal-zero layer) and the MOL wire 134 comprise stacks of one or more two-dimensional materials 125a while the other front-side wires 142 (e.g., on the metal-one layer, the metal-two layer, etc.), the front-side vias 144, and the MOL vias 136 consist of one or more metal layers 125b and are devoid of two-dimensional materials.

Figure 6C:
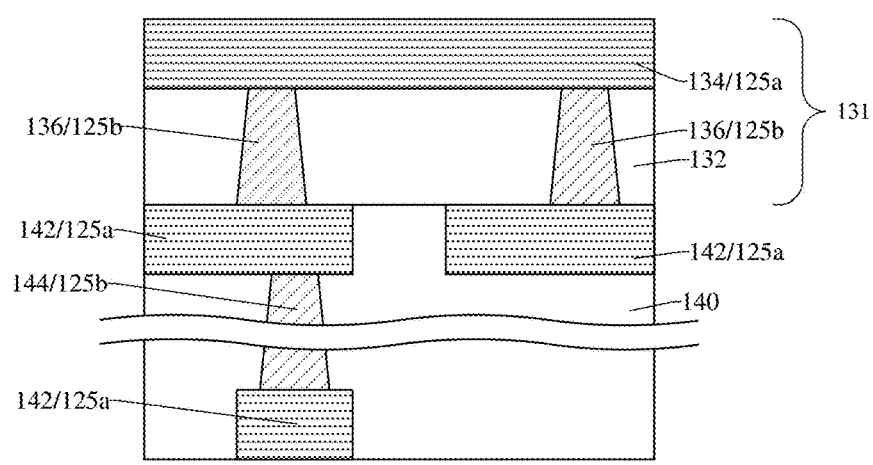

FIG. 6C illustrates a cross-sectional view 620 of some other alternative embodiments of the front-side interconnect structure 138 of FIG. 6A.

In such embodiments, each of the front-side wires 142 and the MOL wires 134 comprise stacks of one or more two-dimensional materials 125a while the front-side vias 144 and the MOL vias 136 consist of one or more metal layers 125b and are devoid of two-dimensional materials.

By controlling which front-side interconnect(s) (e.g. 134, 142, etc.) comprise which material(s) (e.g., one or more metals, one or more two-dimensional materials, or the like), control over the performance characteristics (e.g., resistances or some other characteristic(s)) of the front-side interconnect may be improved, thereby improving a performance of the integrated chip.

Figure 7A:
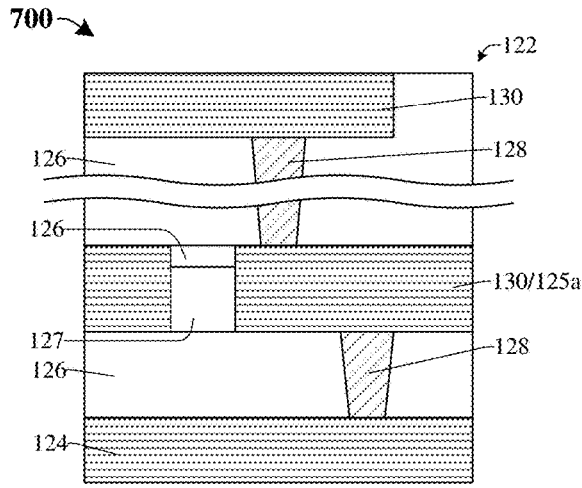
FIGS. 7A-7E illustrate cross-sectional views of some other embodiments of a back-side interconnect structure of FIG. 1.

FIG. 7A illustrates a cross-sectional view 700 of some embodiments of the back-side interconnect structure 122 of FIG. 1.

In such embodiments, any of the wires included in the integrated chip (e.g., 124, 130, 134, 142, etc.) may comprise a stack of one or more two-dimensional materials 125a and may be laterally separated from other wires by one or more cavities 127 that may, for example, comprise air or the like. In some embodiments, the one or more cavities 127 may be defined, at least in part, by sidewalls of the wires.

Figure 7B:
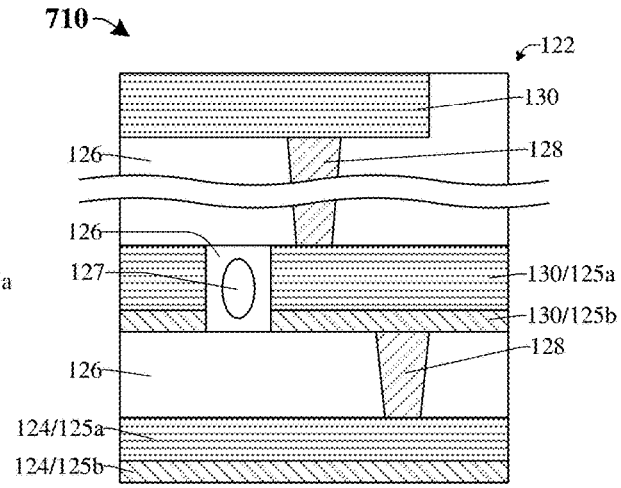

FIG. 7B illustrates a cross-sectional view 710 of some alternative embodiments of the back-side interconnect structure 122 of FIG. 1.

In such embodiments, any of the wires of the integrated chip (e.g., 124, 130, 134, 142, etc.) may comprise a stack of one or more two-dimensional materials 125a and one or more metal layers 125b on the stack of one or more two-dimensional materials 125a. For example, in some embodiments, the back-side wires 130 and/or the first wire 124 may comprise a stack of two-dimensional materials 125a and may further comprise one or more metal layers 125b disposed on a bottom surface of the stack of two-dimensional materials 125a.

Further, in some embodiments, the one or more cavities 127 may be defined by one or more surfaces of the back-side dielectric structure 126. By including the one or more cavities 127 between the wires, an isolation between the wires may be improved. For example, by including the one or more cavities 127 between the wires, a dielectric constant between the wires may be reduced, thereby reducing a capacitance between the wires and hence reducing an RC delay of the integrated chip.

Figure 7C:
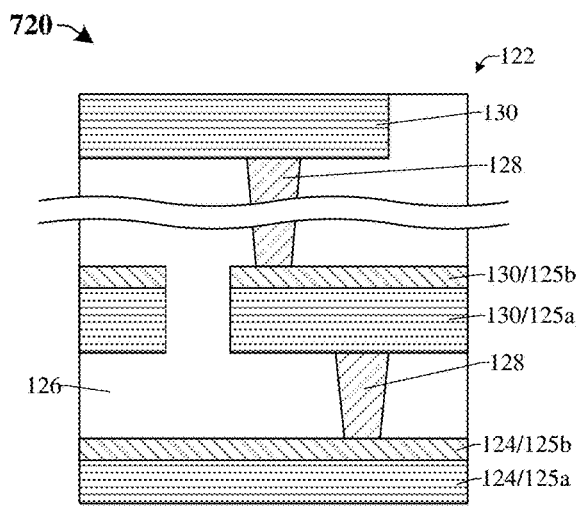

FIG. 7C illustrates a cross-sectional view 720 of some other alternative embodiments of the back-side interconnect structure 122 of FIG. 1.

In such embodiments, any of the wires of the integrated chip (e.g., 124, 130, 134, 142, etc.) may comprise a stack of one or more two-dimensional materials 125a and one or more metal layers 125b on the stack of one or more two-dimensional materials 125a. For example, in some embodiments, the back-side wires 130 and/or the first wire 124 may comprise a stack of two-dimensional materials 125a and may further comprise one or more metal layers 125b disposed on a top surface of the stack of two-dimensional materials 125a.

Figure 7D:
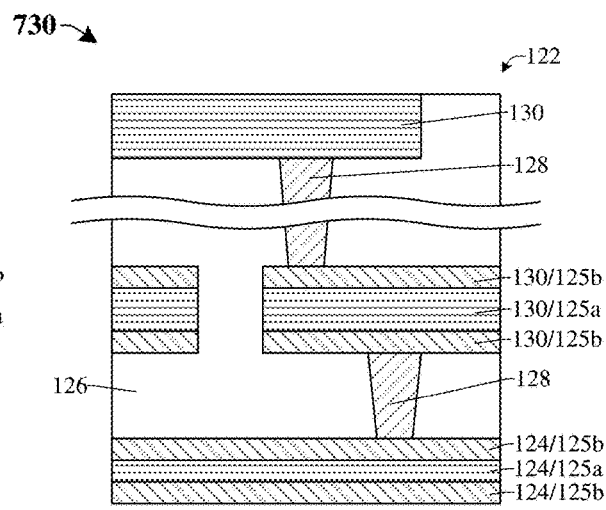

FIG. 7D illustrates a cross-sectional view 730 of some other alternative embodiments of the back-side interconnect structure 122 of FIG. 1.

In such embodiments, any of the wires of the integrated chip (e.g., 124, 130, 134, 142, etc.) may comprise a stack of one or more two-dimensional materials 125a and one or more metal layers 125b on the stack of one or more two-dimensional materials 125a. For example, in some embodiments, the back-side wires 130 and/or the first wire 124 may comprise a stack of two-dimensional materials 125a and may further comprise one or more metal layers 125b disposed on both the bottom surface and on the top surface of the stack of two-dimensional materials 125a.

Figure 7E:
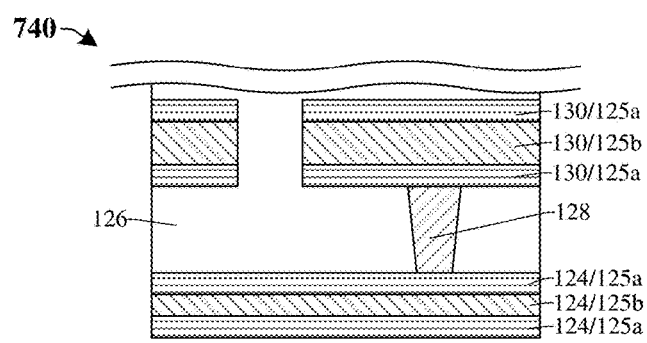

FIG. 7E illustrates a cross-sectional view 740 of some other alternative embodiments of the back-side interconnect structure 122 of FIG. 1.

In such embodiments, any of the wires of the integrated chip (e.g., 124, 130, 134, 142, etc.) may comprise a stack of one or more two-dimensional materials 125a and one or more metal layers 125b. For example, in some embodiments, the back-side wires 130 and/or the first wire 124 may, for example, comprise a first stack of two-dimensional materials 125a, a second stack of two-dimensional materials 125a, and one or more metal layers 125b arranged between the first stack of two-dimensional materials 125a and the second stack of two-dimensional materials 125a.

By controlling which materials are included in each of the wires of the integrated chip (e.g., 124, 130, 134, 142, etc.), a control over the performance characteristics of said wires may be improved, thereby improving a performance of the integrated chip.

FIGS. 8-27 illustrate cross-sectional views 800-2700 of some embodiments of a method for forming an integrated chip comprising a source/drain contact 120 that is on a back-side 102b of a semiconductor device 102 and further comprising a first wire 124 that comprises a stack of conductive monolayers. Although FIGS. 8-27 are described in relation to a method, it will be appreciated that the structures disclosed in FIGS. 8-27 are not limited to such a method, but instead may stand alone as structures independent of the method.

Figure 8:
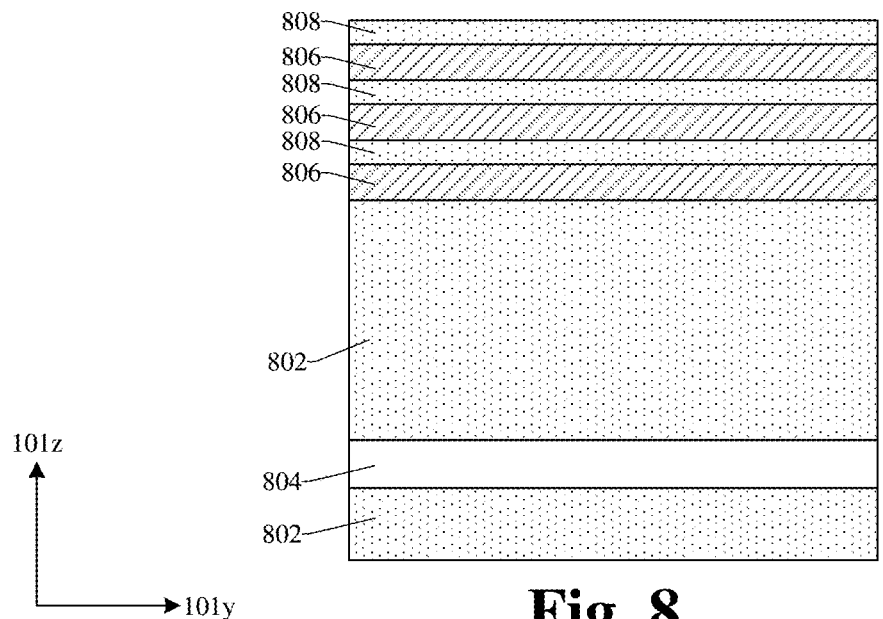
FIGS. 8-27 illustrate cross-sectional views of some embodiments of a method for forming an integrated chip comprising a source/drain contact that is on a back-side of a semiconductor device and further comprising a first wire that comprises a stack of conductive monolayers.

As shown in cross-sectional view 800 of FIG. 8, a substrate 802 is provided and a dielectric layer 804 is disposed within the substrate 802. Further, a plurality of first semiconductor layers 806 and a plurality of second semiconductor layers 808 are alternatingly formed over the substrate 802.

In some embodiments, the substrate 802 may, for example, comprise silicon or some other suitable material. In some embodiments, the substrate 802 is a silicon-on-insulator (SOI) substrate or some other suitable type of substrate. In some embodiments, the plurality of first semiconductor layers 806 may, for example, be formed by epitaxially growing silicon germanium or some other suitable material over the substrate 802. In some embodiments, the plurality of second semiconductor layers 808 may, for example be formed by epitaxially growing silicon or some other suitable material over the substrate 802.

In some alternative embodiments, the plurality of first semiconductor layers 806 and the plurality of second semiconductor layers 808 may be deposited rather than grown, and the deposition may, for example, comprise a chemical vapor deposition (CVD) process, a physical vapor deposition (PVD) process, an atomic layer deposition (ALD) process, or some other suitable deposition process.

Figure 9:
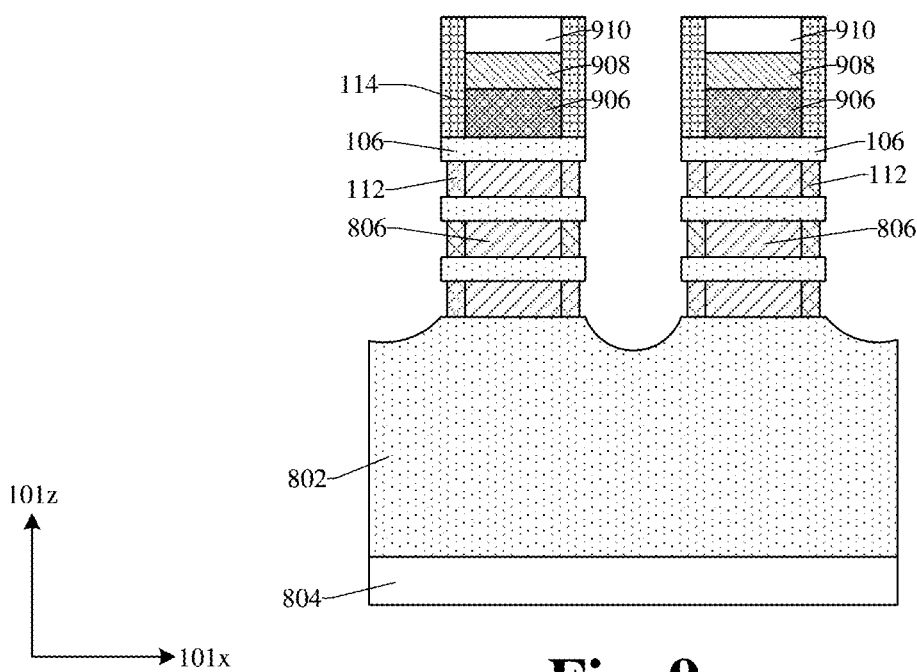

As shown in cross-sectional view 900 of FIG. 9, a pair of stacks of channel structures 106 are formed over the substrate 802, a pair of dummy gate structures 906 are formed over the pair of stacks of channel structures 106, a pair of hard masks 908 are formed over the pair of dummy gate structures 906, a pair of dielectric structures 910 are formed over the pair of hard masks 908, gate spacers 114 are formed along sidewalls of the pair of dummy gate structures 906, and inner spacers 112 are formed along sidewalls of the first semiconductor layers 806.

In some embodiments, the pair of stacks of channel structures 106 may be formed by patterning the first semiconductor layers 806 and the second semiconductor layers 808. For example, a dummy gate layer (not shown) may be formed over the first semiconductor layers 806 and the second semiconductor layers 808, a hard mask layer (not shown) may be formed over the dummy gate layer, a dielectric layer (not shown) may be formed over the hard mask layer, and the dummy gate layer, the hard mask layer, and the dielectric layer may be patterned (e.g., by one or more photolithography process, one or more etching processes, or the like) to define the pair of dummy gate structures 906, the pair of hard masks 908, and the pair of dielectric structures 910. Further, a gate spacer layer (not shown) may be deposited and patterned to define the gate spacers 114. Furthermore, the first semiconductor layers 806, the second semiconductor layers 808, and the substrate 802 may be patterned according to the pair of dummy gate structures 906, the pair of hard masks 908, the pair of dielectric structures 910, and the gate spacers 114 to form the pair of stacks of channel structures 106 from the second semiconductor layers 808. In addition, sidewalls of the first semiconductor layers 806 may be recessed relative to sidewalls of the pair of stacks of channel structures 106 and the inner spacers 112 may be formed on the recessed sidewalls of the first semiconductor layers 806.

In some embodiments, a back-side of the substrate 802 is thinned to remove the substrate 802 from below the dielectric layer 804.

Figure 10:
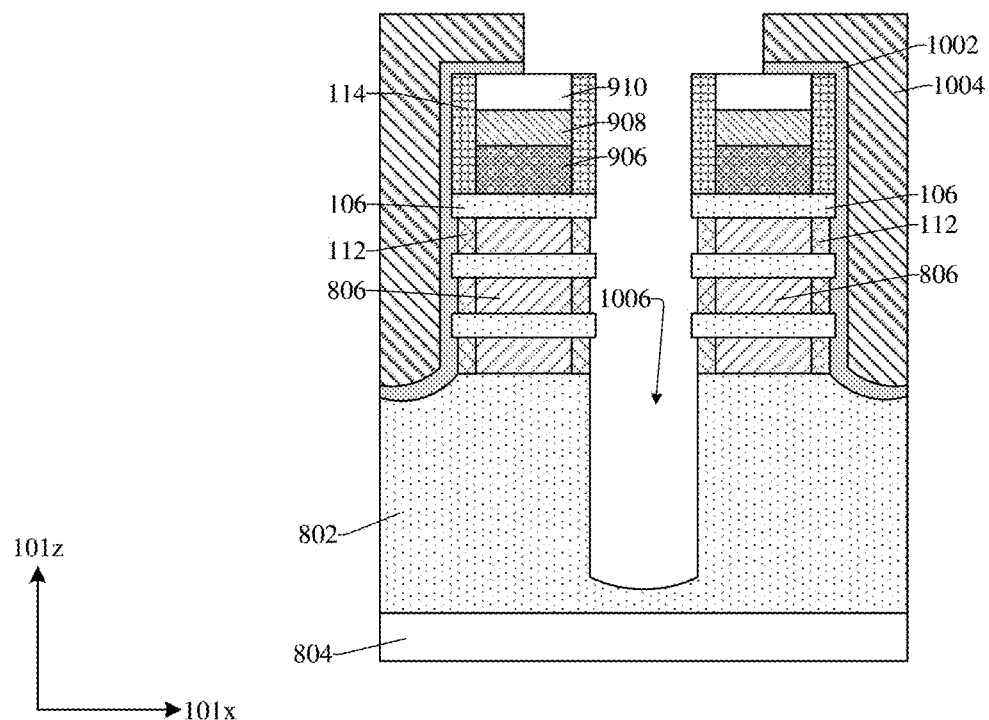

As shown in cross-sectional view 1000 of FIG. 10, a first masking layer 1002 is formed along opposing sidewalls of the pair of stacks of channel structures 106 and a second masking layer 1004 is formed over the first masking layer 1002. Further, the substrate 802 is patterned with the first masking layer 1002 and the second masking layer 1004 in place to form a first contact opening 1006 in the substrate 802.

In some embodiments, the first masking layer 1002 may be a hard mask and may, for example, be formed by depositing silicon nitride or some other suitable material over the substrate 802 by a CVD process, a PVD process, an ALD process, or some other suitable process. In some embodiments, the second masking layer 1004 may be a hard mask, a photoresist mask, or the like and may, for example, be formed by forming silicon nitride, photoresist, or some other suitable material over the substrate 802. In some embodiments, the patterning may, for example, comprise an etching process (e.g., a wet etching process, a dry etching process, or some other suitable etching process) or some other suitable process.

Figure 11:
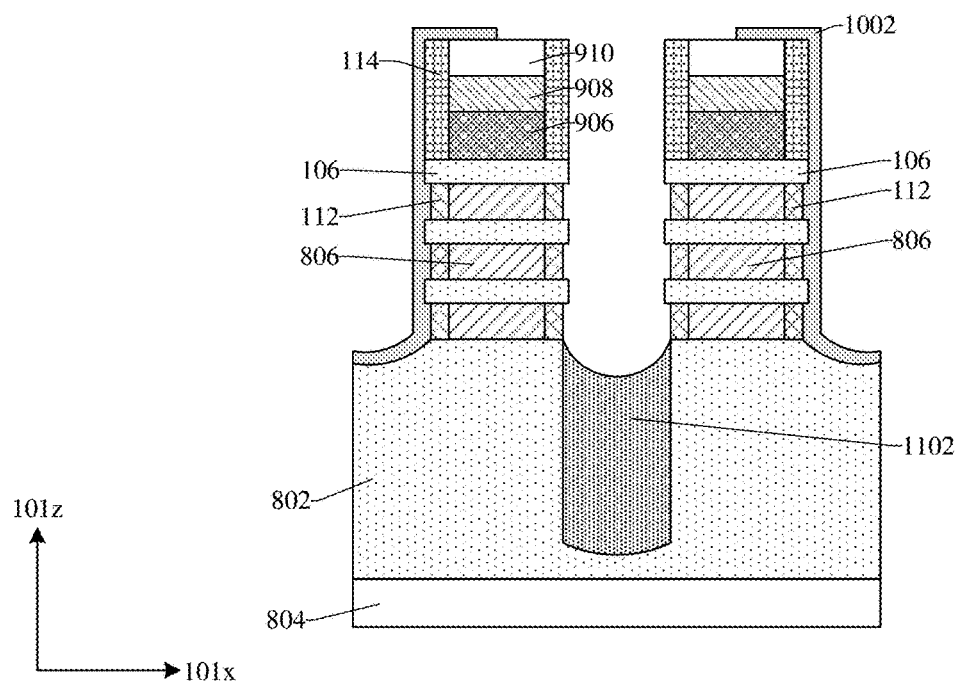

As shown in cross-sectional view 1100 of FIG. 11, the second masking layer 1004 is removed and a first dummy contact 1102 is formed in the first contact opening 1006 (e.g., within the substrate 802 and between the pair of stacks of channel structures 106). In some embodiments, the first dummy contact 1102 may, for example, be formed by epitaxially growing or depositing (e.g., by CVD, PVD, ALD, or the like) undoped silicon germanium or some other suitable material in the first contact opening 1006.

Figure 12:
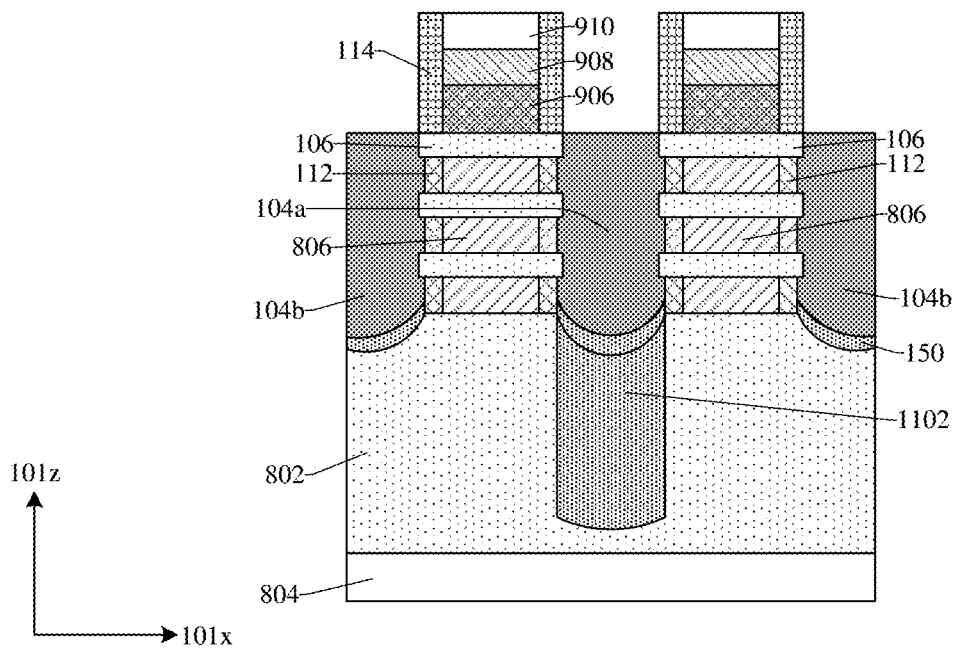

As shown in cross-sectional view 1200 of FIG. 12, a common source/drain structure 104a is formed between the pair of stacks of channel structures 106 and a pair of individual source/drain structures 104b are formed on opposing sides of the pair of stacks of channel structures 106.

In some embodiments, the common source/drain structure 104a and the pair of individual source/drain structures 104b may, for example, be formed by epitaxially growing silicon germanium or some other suitable material over the substrate 802. In some alternative embodiments, the common source/drain structure 104a and the pair of individual source/drain structures 104b may, for example, be formed by depositing silicon germanium or some other suitable material over the substrate 802 by a CVD process, a PVD process, an ALD process, or some other suitable process. In some embodiments, the common source/drain structure 104a and the pair of individual source/drain structures 104b may be doped such that said structures comprise doped silicon germanium or some other suitable material.

In some embodiments, an undoped semiconductor layer 150 may be formed along a front-side of the substrate 802 before forming the common source/drain structure 104a and the pair of individual source/drain structures 104b.

Figure 13:
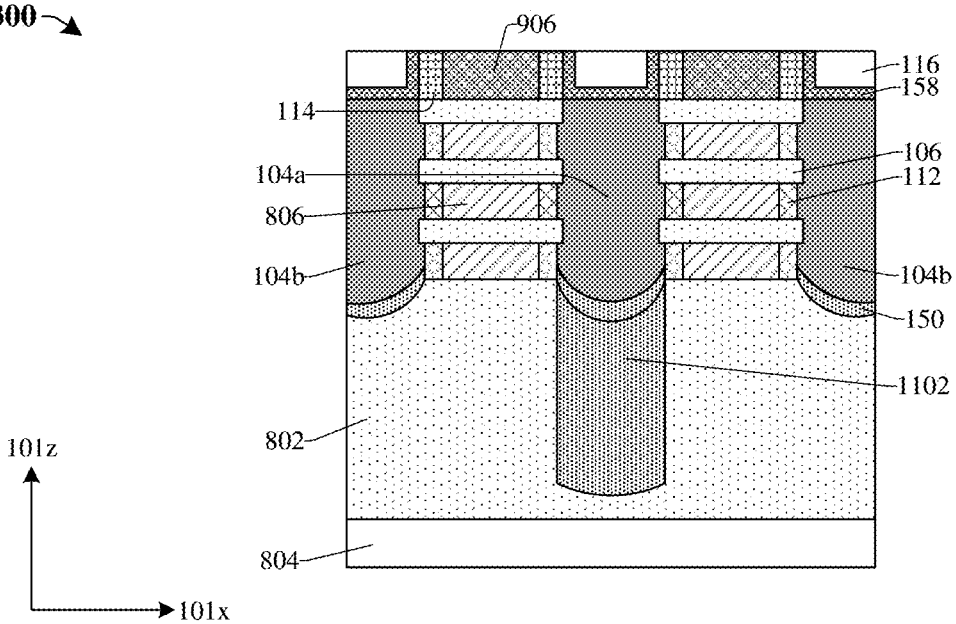

As shown in cross-sectional view 1300 of FIG. 13, a front-side etch-stop layer 158 is formed along a front-side of the individual source/drain structures 104b and the common source/drain structure 104a. Further, a first front-side dielectric layer 116 is formed over the front-side etch-stop layer 158. Furthermore, the hard masks 908 and the pair of dielectric structures 910 are removed from over the pair of dummy gate structures 906.

In some embodiments, the front-side etch-stop layer 158 may, for example, be formed by depositing silicon nitride, silicon carbide, aluminum oxide, or some other suitable dielectric by a CVD process, a PVD process, an ALD process, or some other suitable process. In some embodiments, the first front-side dielectric layer 116 may, for example, be formed by depositing silicon dioxide, silicon nitride, silicon carbide, silicon oxynitride, silicon oxycarbide, silicon oxycarbonitride, some Si—O—C—H dielectric, or some other suitable material by a CVD process, a PVD process, an ALD process, or some other suitable process.

In some embodiments, the hard masks 908 and the dielectric structures 910 may, for example, be removed by a planarization process (e.g., a chemical mechanical planarization (CMP) process or some other suitable planarization process) or some other suitable process.

Figure 14:
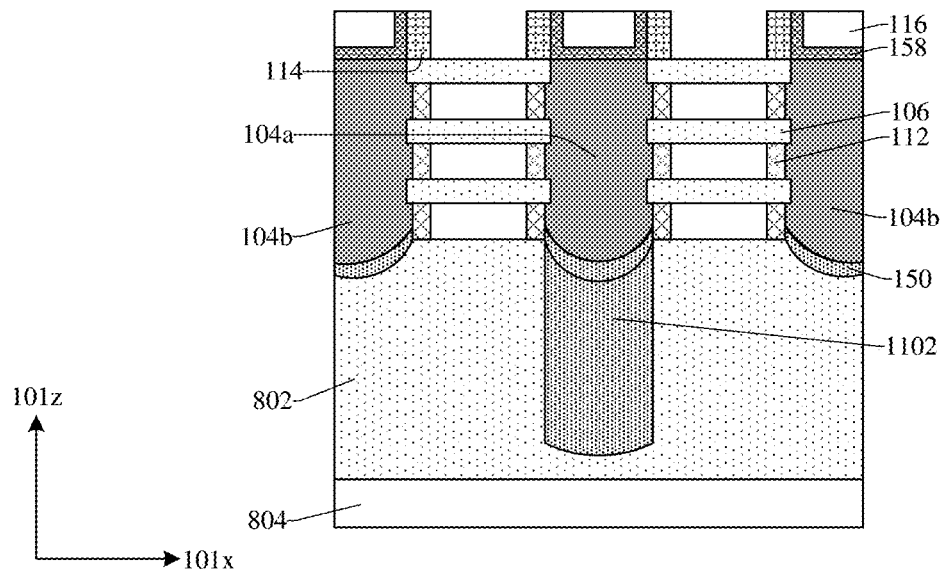

As shown in cross-sectional view 1400 of FIG. 14, the dummy gate structures 906 and the second semiconductor layers 808 are removed from between the gate spacers 114, from between the inner spacers 112, and from over the substrate 802. The removal may, for example, comprise an etching process (e.g., a wet etching process, a dry etching process, or some other suitable etching process) or some other suitable process.

Figure 15:
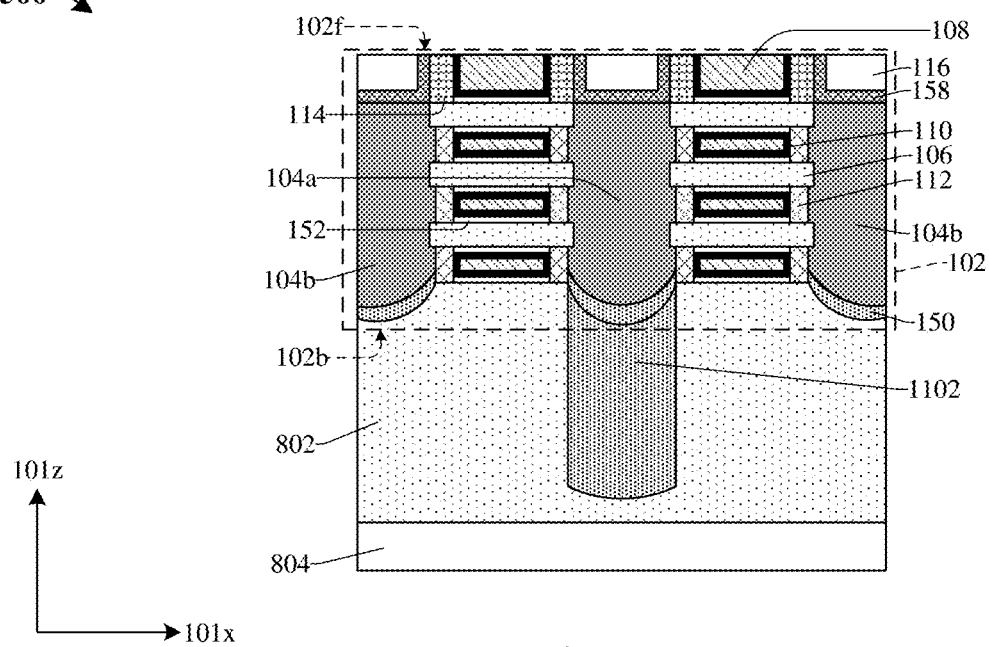

As shown in cross-sectional view 1500 of FIG. 15, an interfacial layer 152 is formed around the pair of stacks of channel structures 106, a gate dielectric layer 110 is formed around the interfacial layer 152, and a pair of gate structures 108 are formed around the gate dielectric layer 110 and surrounding the pair of stacks of channel structures 106.

In some embodiments, the interfacial layer 152 may, for example, be formed by depositing aluminum oxide, aluminum nitride, hafnium oxide, hafnium nitride, some other metal-oxide, some other metal-nitride, silicon dioxide, silicon nitride, silicon carbide, silicon oxycarbide, silicon oxynitride, silicon oxycarbonitride, or some other suitable dielectric material on the pair of stacks of channel structures 106 by a CVD process, a PVD process, an ALD process, or some other suitable process.

In some embodiments, the gate dielectric layer 110 may, for example, be formed by depositing aluminum oxide, aluminum nitride, hafnium oxide, hafnium nitride, silicon dioxide, silicon nitride, or some other suitable material on the interfacial layer 152 by a CVD process, a PVD process, an ALD process, or some other suitable process.

In some embodiments, the pair of gate structures 108 may, for example, be formed by depositing copper, cobalt, nickel, ruthenium, iridium, aluminum, platinum, palladium, gold, silver, osmium, molybdenum, tungsten, some other metal, or some other suitable conductive material by a CVD process, a PVD process, an ALD process, a sputtering process, an electroless deposition (ELD) process, an electrochemical plating (ECP) process, or some other suitable process.

Figure 16:
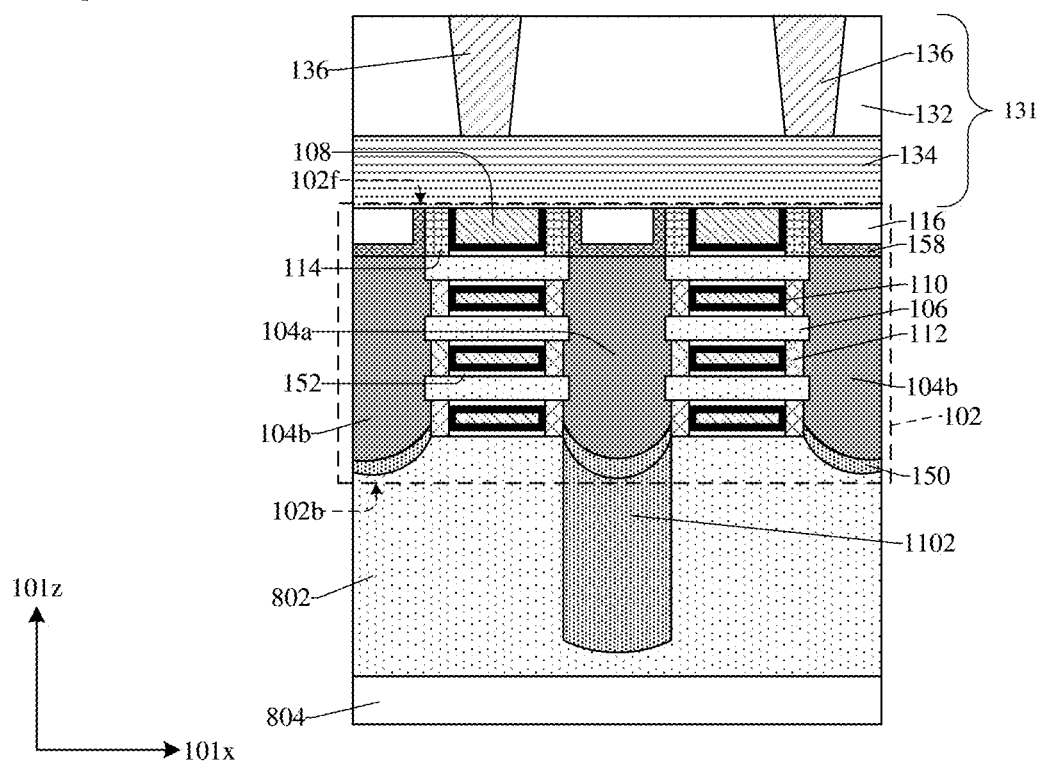

As shown in cross-sectional view 1600 of FIG. 16, a MOL interconnect structure 131 is formed along the front-side 102f of the semiconductor device 102. For example, a MOL wire 134 is formed along the front-side 102f of the semiconductor device 102 and on the pair of gate structures 108. Further, MOL vias 136 may, for example, be formed over the MOL wire 134 and within a MOL dielectric structure 132.

In some embodiments, forming the MOL interconnect structure 131 may, for example, comprise one or more deposition processes, one or more patterning processes, one or more planarization processes, or some other suitable processes. For example, in some embodiments, forming the MOL wire 134 may comprise depositing a stack of one or more two-dimensional materials and/or depositing one or more metal layers (see, for example, FIGS. 6A-6C).

Figure 17:
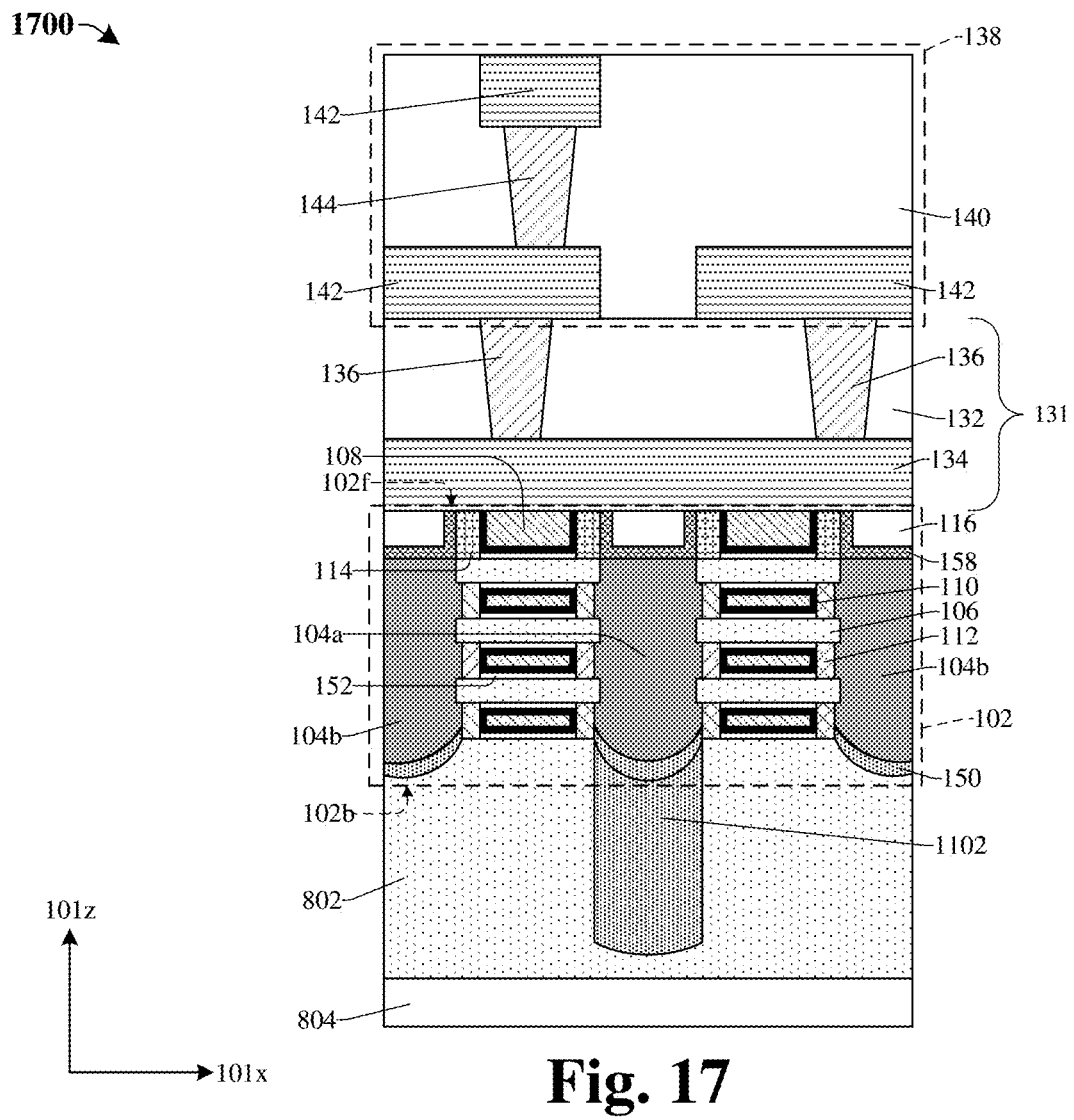

As shown in cross-sectional view 1700 of FIG. 17, a front-side interconnect structure 138 is formed over the MOL interconnect structure 131. For example, one or more front-side wires 142 and one or more front-side vias 144 may be formed over the MOL interconnect structure 131 and within a front-side dielectric structure 140.

In some embodiments, forming the front-side interconnect structure 138 may, for example, comprise one or more deposition processes, one or more patterning processes, one or more planarization processes, or some other suitable processes.

In some embodiments, forming the one or more front-side wires 142 may, for example, comprise depositing one or more layers of one or more two-dimensional materials (e.g., depositing one or more conductive monolayers) to form a stack of one or more two-dimensional materials and/or may comprise depositing one or more metal layers (see, for example, FIGS. 6A-6C).

Figure 18:
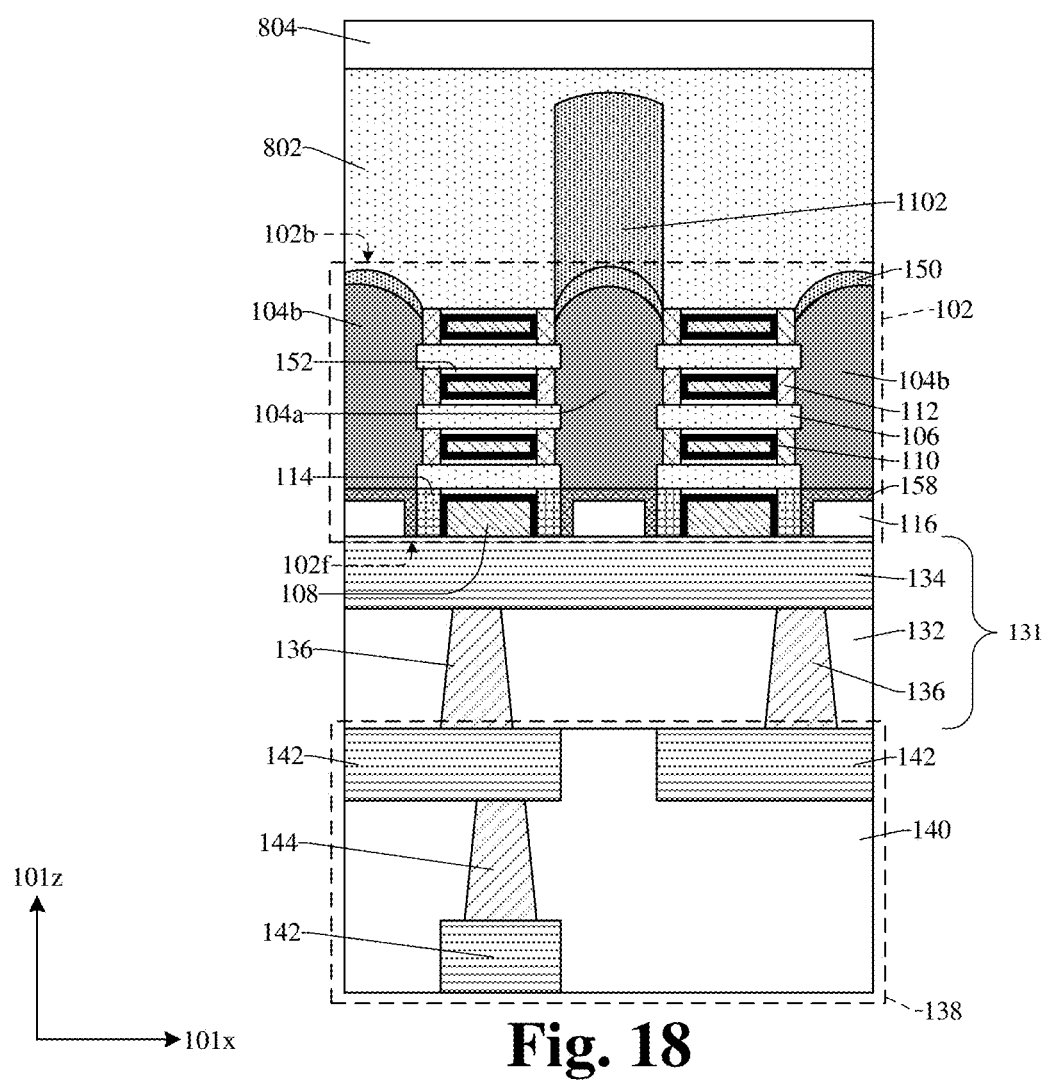

As shown in cross-sectional view 1800 of FIG. 18, the semiconductor device 102 is rotated such that a back-side 102b of the semiconductor device 102 is over the front-side 102f of the semiconductor device 102. Further, the front-side interconnect structure 138 may be bonded to a carrier substrate (not shown) underlying the front-side interconnect structure 138.

Figure 19:
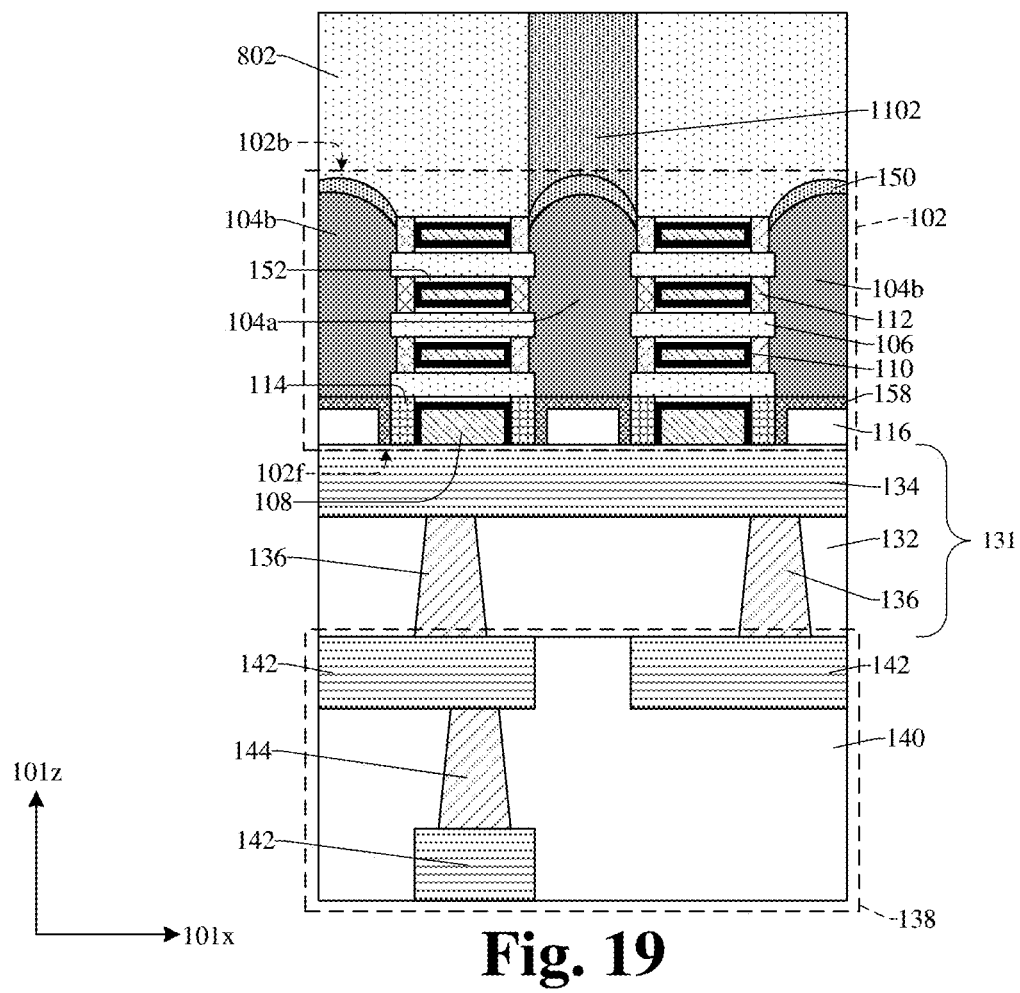

As shown in cross-sectional view 1900 of FIG. 19, the dielectric layer 804 is removed from the back-side of the substrate 802 and the back-side of the substrate 802 is thinned. Removing the dielectric layer 804 and thinning the substrate 802 may, for example, comprise an etching process (e.g., a wet etching process, a dry etching process, or some other suitable etching process), a planarization process (e.g., a CMP or some other suitable planarization process), or some other suitable process.

Figure 20:
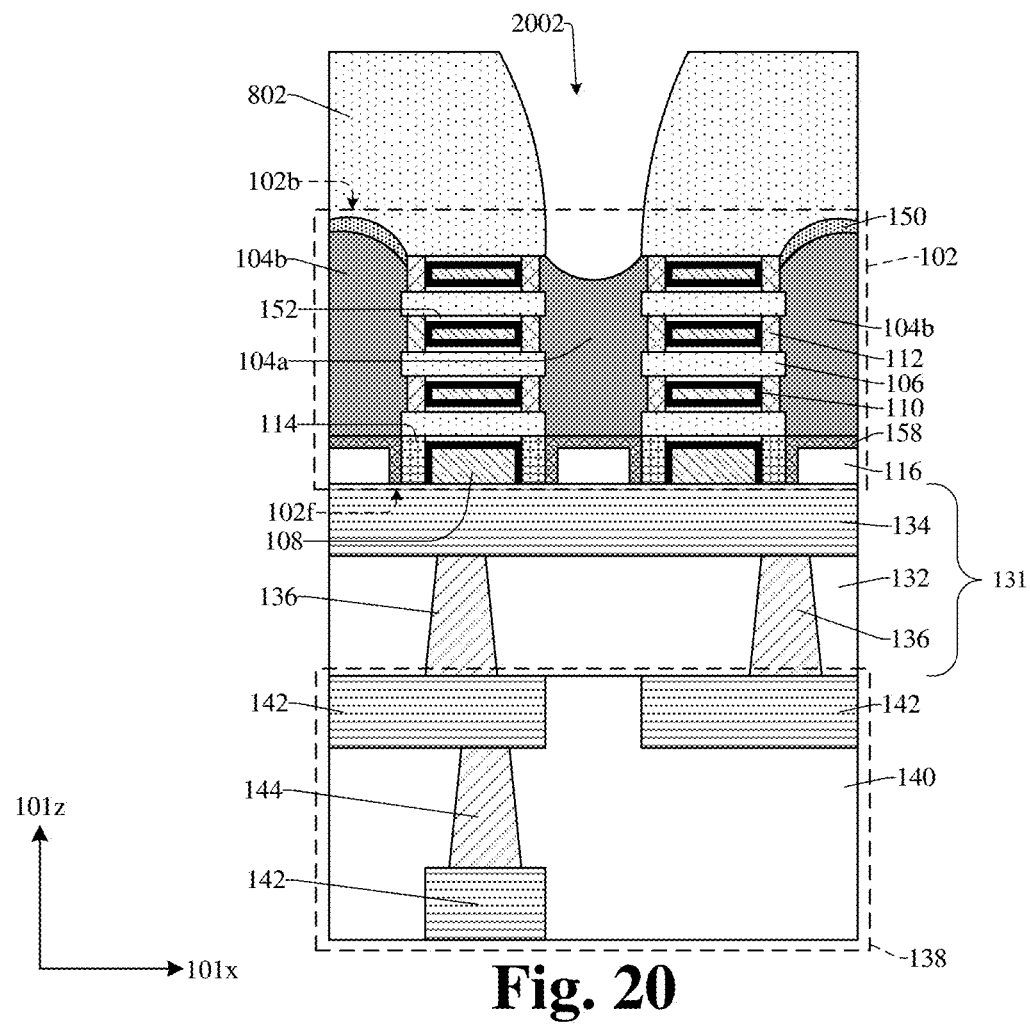

As shown in cross-sectional view 2000 of FIG. 20, the first dummy contact 1102 is removed from within the substrate 802, thereby leaving a second contact opening 2002 in place of the first dummy contact 1102. In some embodiments, the first dummy contact removal process may comprise an etching process (e.g., a wet etching process, a dry etching process, or some other suitable etching process) or some other suitable process. For example, in some embodiments, removing the first dummy contact 1102 may comprise patterning a back-side of the substrate 802 to remove the first dummy contact 1102 from within the substrate 802.

Figure 21:
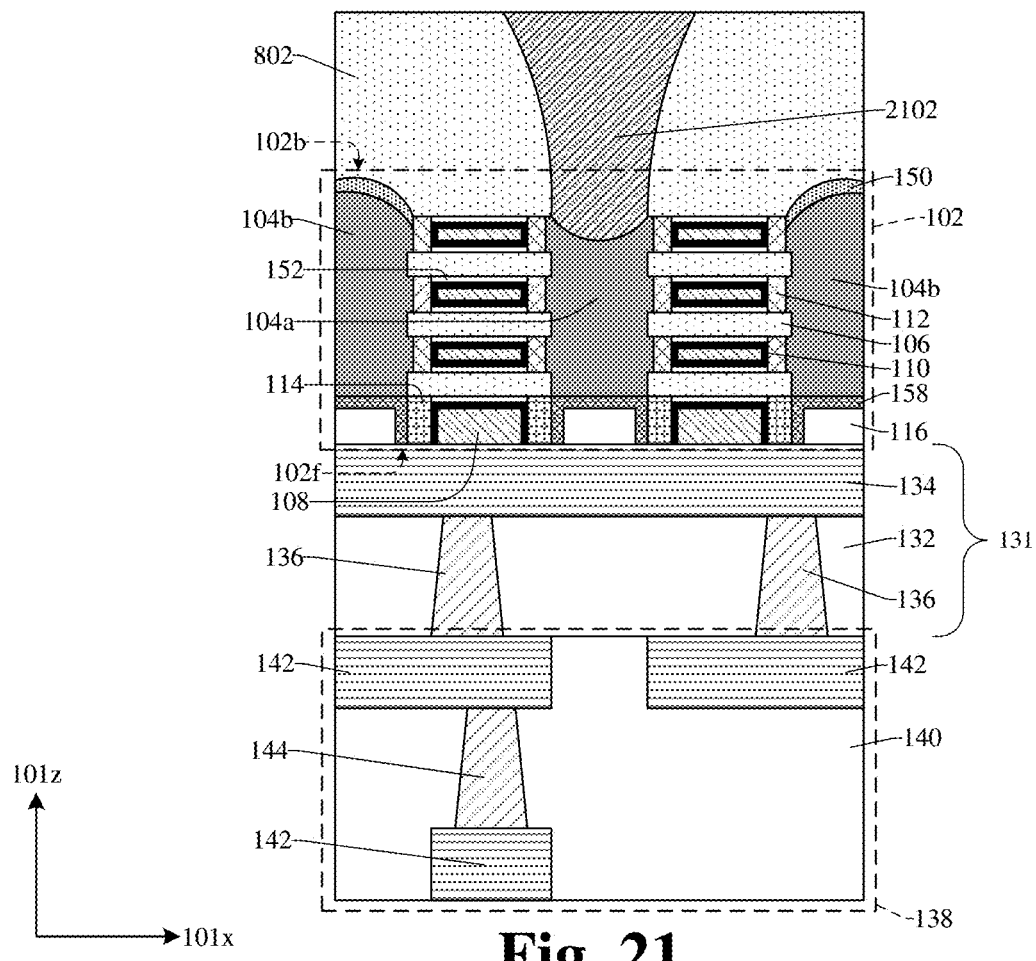

As shown in cross-sectional view 2100 of FIG. 21, a second dummy contact 2102 is formed in the second contact opening 2002 (e.g., in place of the first dummy contact 1102). In some embodiments, the second dummy contact 2102 may, for example, be formed by depositing silicon dioxide, silicon nitride, or some other suitable material in the second contact opening 2002 by a CVD process, a PVD process, an ALD process, or some other suitable process.

Figure 22:
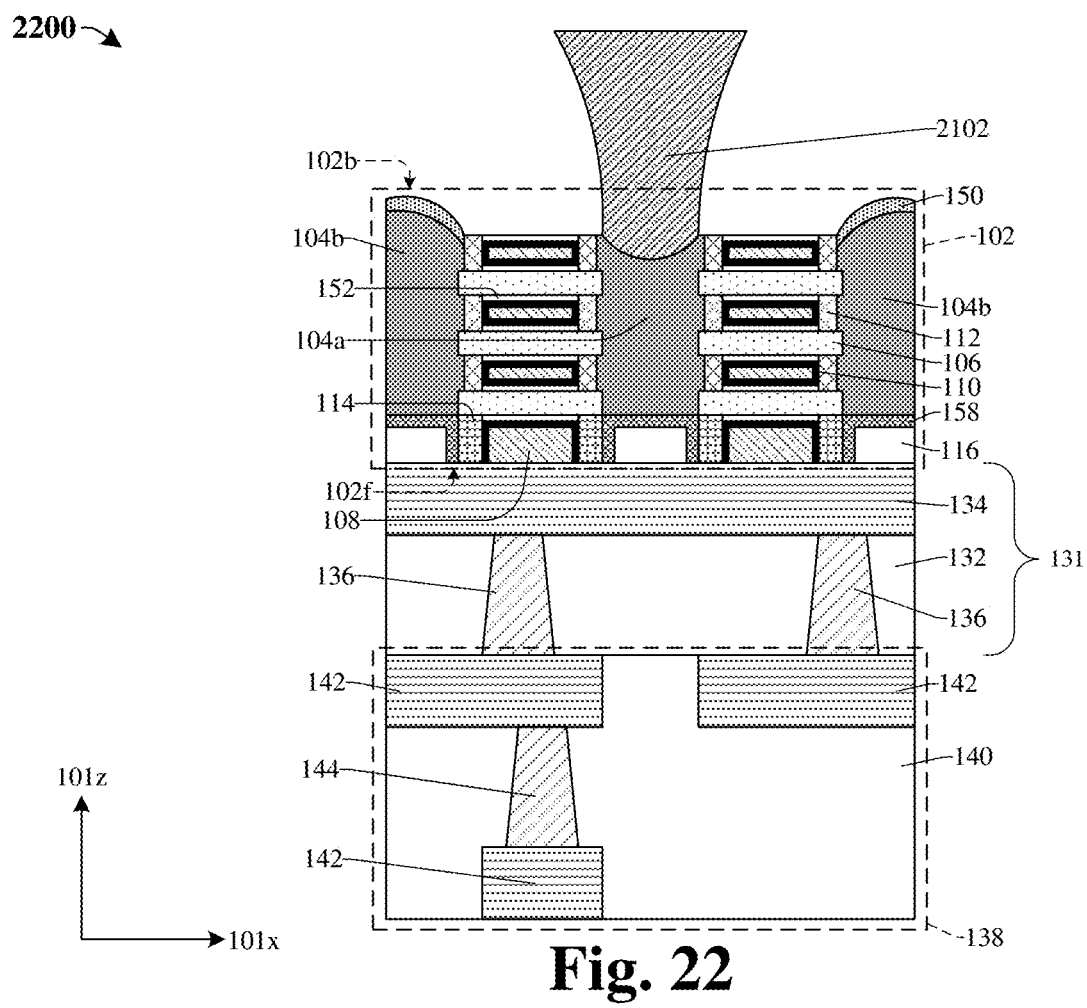

As shown in cross-sectional view 2200 of FIG. 22, the substrate 802 is removed from the back-side 102b of the semiconductor device 102 and from opposing sides of the second dummy contact 2102. In some embodiments, the substrate 802 may, for example, be removed by an etching process (e.g., a wet etching process, a dry etching process, or some other suitable etching process) or some other suitable process.

Figure 23:
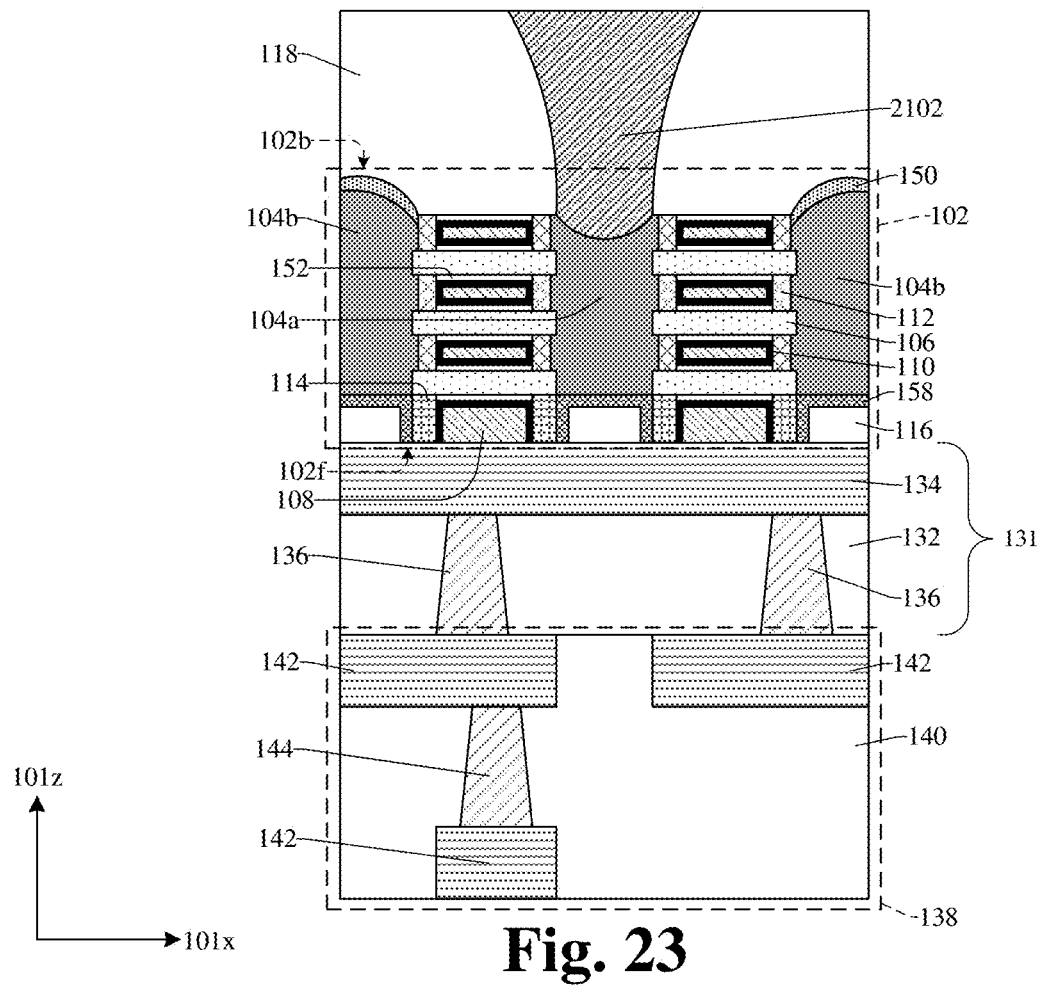

As shown in cross-sectional view 2300 of FIG. 23, a first back-side dielectric layer 118 is formed in place of the substrate 802 on the back-side 102b of the semiconductor device 102 and on opposing sides of the second dummy contact 2102. In some embodiments, the first back-side dielectric layer 118 may, for example, be formed by depositing silicon dioxide, silicon nitride, silicon oxynitride, silicon oxycarbide, silicon oxycarbonitride, or some other dielectric material by a CVD process, a PVD process, an ALD process, or some other suitable process.

Figure 24:
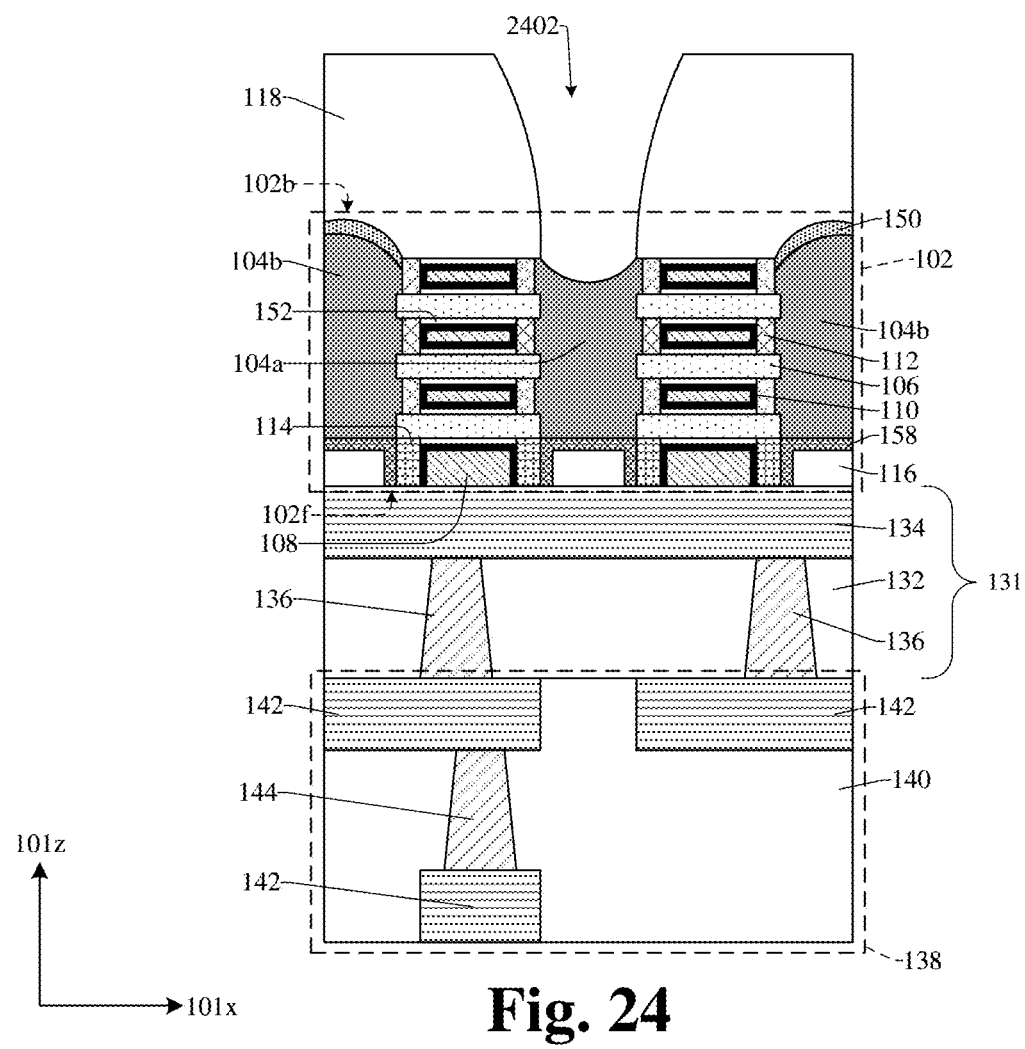

As shown in cross-sectional view 2400 of FIG. 24, the second dummy contact 2102 is removed from between sidewalls of the first back-side dielectric layer 118, thereby leaving a third contact opening 2402 in place of the second dummy contact 2102. In some embodiments, the second dummy contact 2102 is removed by an etching process (e.g., a wet etching process, a dry etching process, or some other suitable etching process) or some other suitable process.

Figure 25:
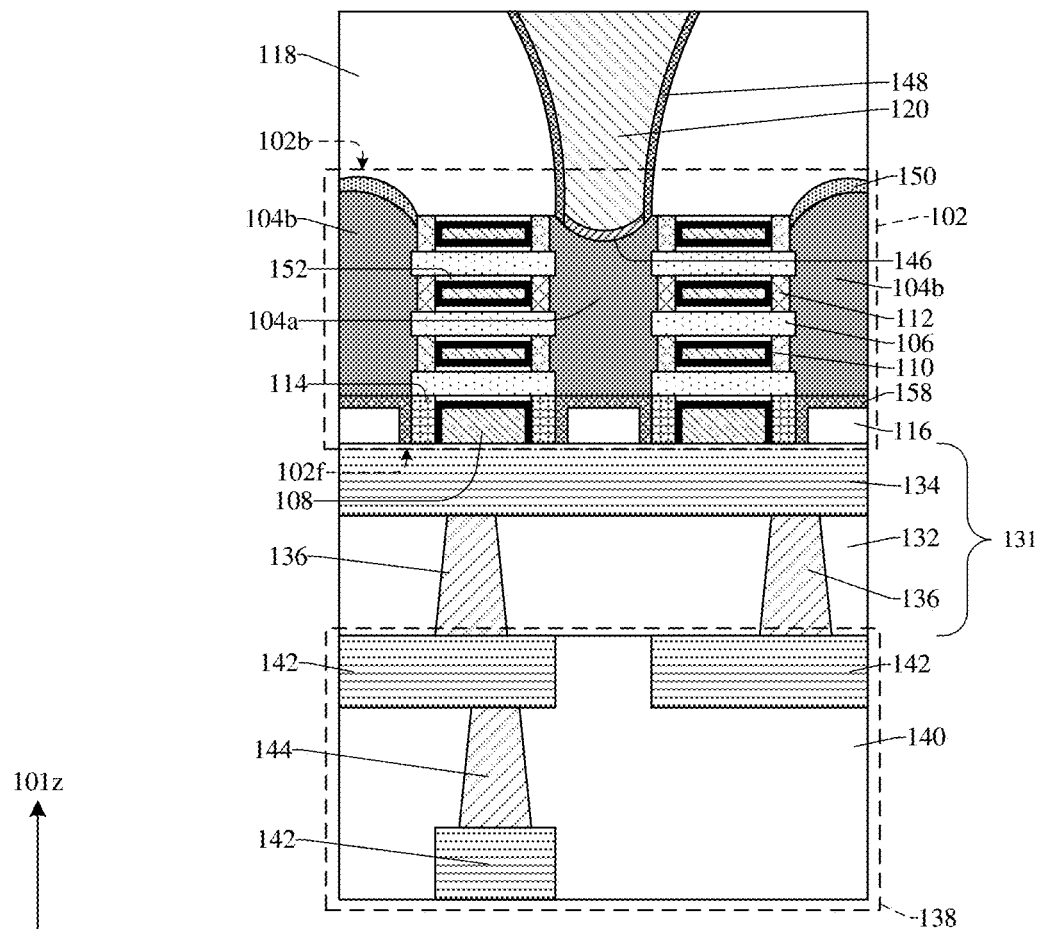

As shown in cross-sectional view 2500 of FIG. 25, a source/drain contact 120 is formed in the third contact opening 2402 (e.g., in place of the second dummy contact 2102 and hence in place of the first dummy contact 1102) within the first back-side dielectric layer 118. In some embodiments, the source/drain contact 120 is formed by depositing copper, cobalt, nickel, ruthenium, iridium, aluminum, platinum, palladium, gold, silver, osmium, molybdenum, tungsten, some other metal, or some other suitable conductive material in the third contact opening 2402 by an ELD process, an ECP process, a sputtering process, or some other suitable process, and by performing a planarization process (e.g., a CMP process or some other suitable planarization process) on the deposited material after the deposition.

In some embodiments, a dielectric liner layer 148 is formed along sidewalls of the first back-side dielectric layer 118 that define the third contact opening 2402 before forming the source/drain contact 120. Further, in some embodiments, a layer of silicide 146 is formed at an interface between the source/drain contact 120 and the common source/drain structure 104a.

Figure 26:
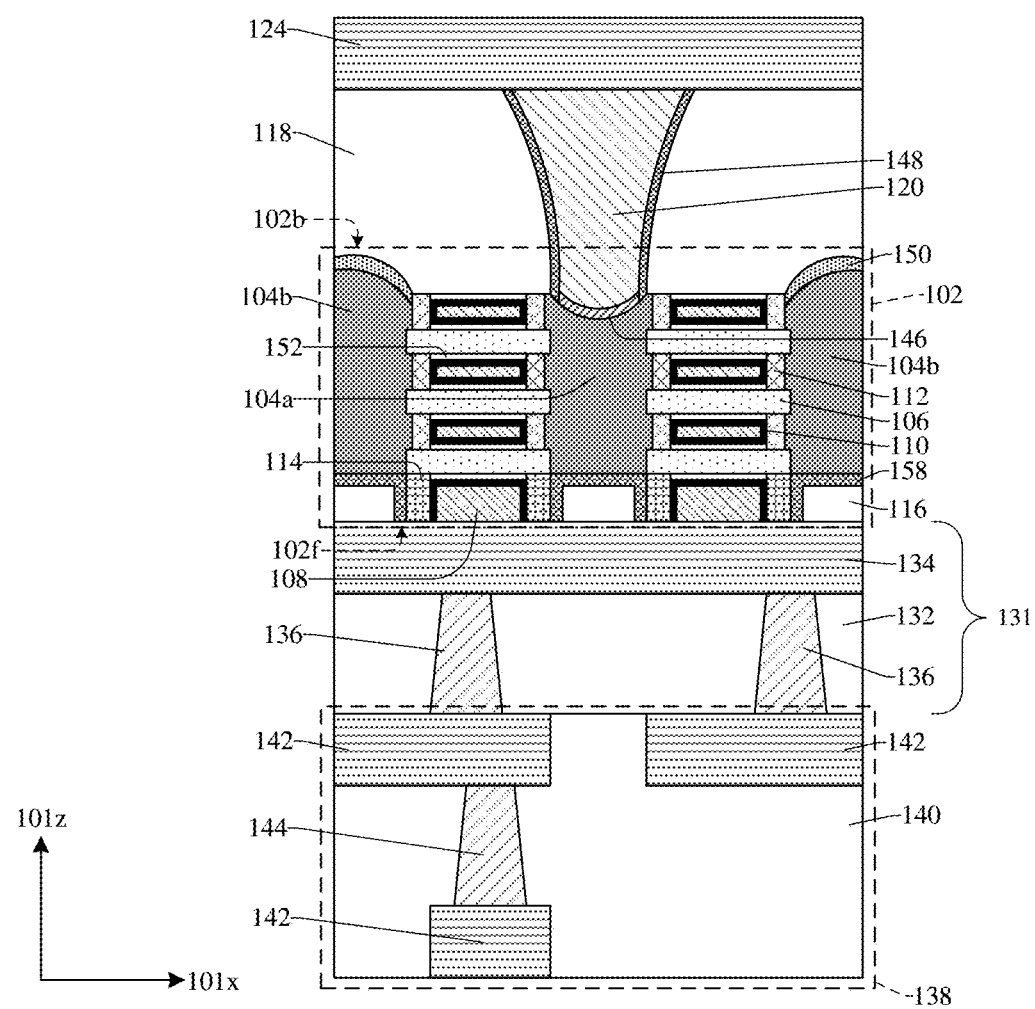

As shown in cross-sectional view 2600 of FIG. 26, a first wire 124 is formed over the source/drain contact 120 along the back-side 102b of the semiconductor device 102. The first wire 124 comprises a stack of conductive monolayers (e.g., a stack of one or more two-dimensional materials).

In some embodiments, the first wire 124 may, for example, be formed by depositing a stack of graphene, some intercalated graphene, some transition metal dichalcogenide, some other two-dimensional material, or some other suitable material over the substrate by an ALD process, a CVD process, a plasma-enhanced ALD process, a plasma-enhanced CVD process, a PVD process, or some other suitable process (see, for example, FIGS. 5A and 5B). In some embodiments, a temperature during the deposition may, for example, be about 200 to 1200 degrees Celsius or some other suitable value. In some embodiments, graphene or some other suitable two-dimensional material may be deposited and subsequently intercalated with one or more metals. In some embodiments, the intercalation process may, for example, comprise a thermal CVD process, a PECVD process, an electrochemical deposition process, or some other suitable process In some embodiments, the first wire 124 may be formed by further depositing copper, cobalt, nickel, ruthenium, iridium, aluminum, platinum, palladium, gold, silver, osmium, molybdenum, tungsten, or some other metal on the stack of conductive monolayers by an ELD process, an ECP process, a sputtering process, an ALD process, or some other suitable process (see, for example, FIGS. 7A-7E).

Figure 27:
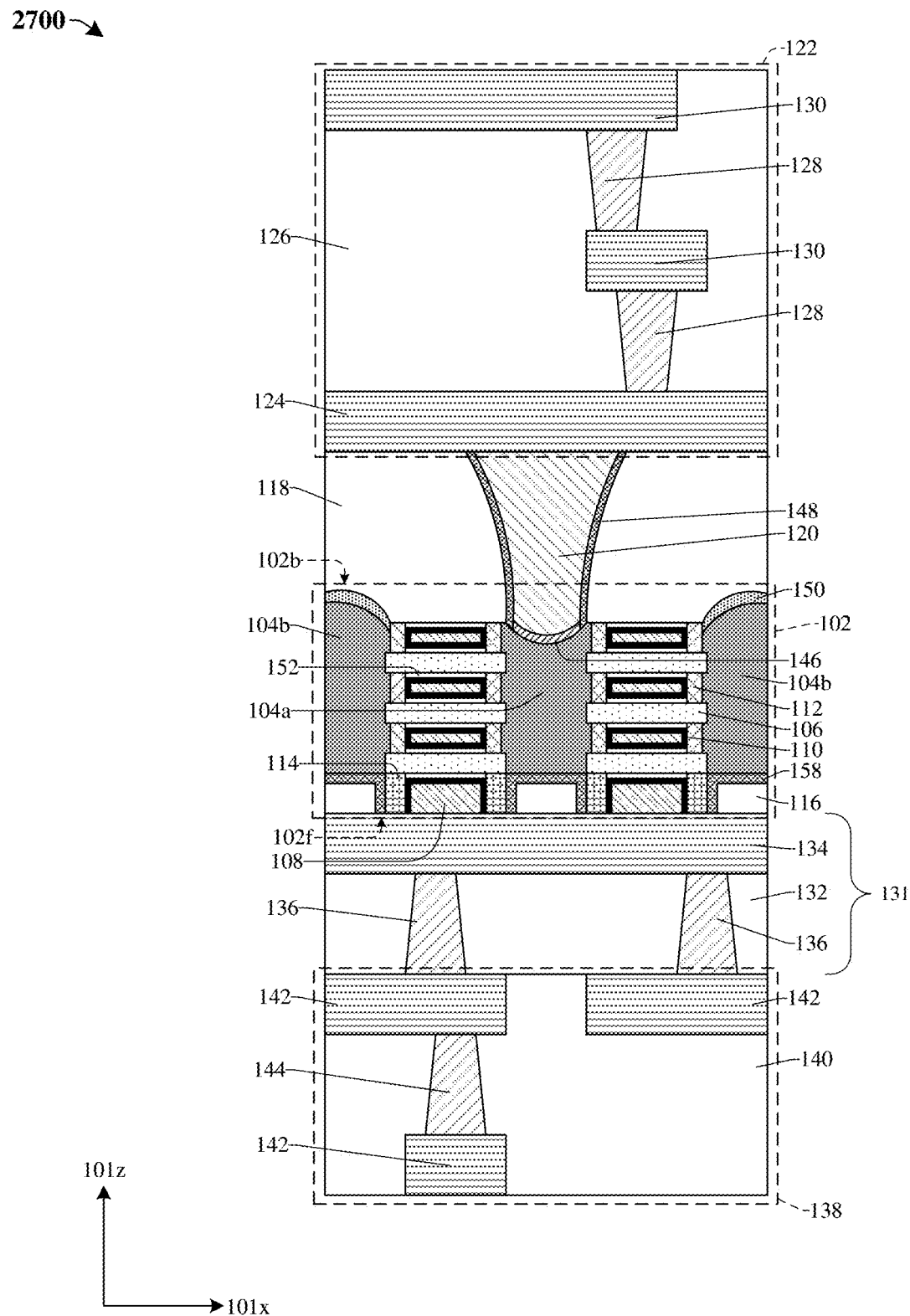

As shown in cross-sectional view 2700 of FIG. 27, a back-side interconnect structure 122 is formed over the first wire 124. For example, one or more back-side vias 128 and back-side wires 130 may be formed over the first wire 124 and within a back-side dielectric structure 126.

In some embodiments, the back-side interconnect structure 122 may be formed by one or more deposition processes, one or more patterning processes, one or more planarization processes, or some other suitable process. For example, in some embodiments, forming the one or more back-side wires 130 may comprise depositing one or more stacks of one or more two-dimensional materials and/or depositing one or more metal layers (see, for example, FIGS. 5A, 5B, and 7A-7E). In some embodiments, a deposition temperature during the formation of the back-side vias 128 may, for example, be less than about 700 degrees Celsius or some other suitable value.

Figure 28:
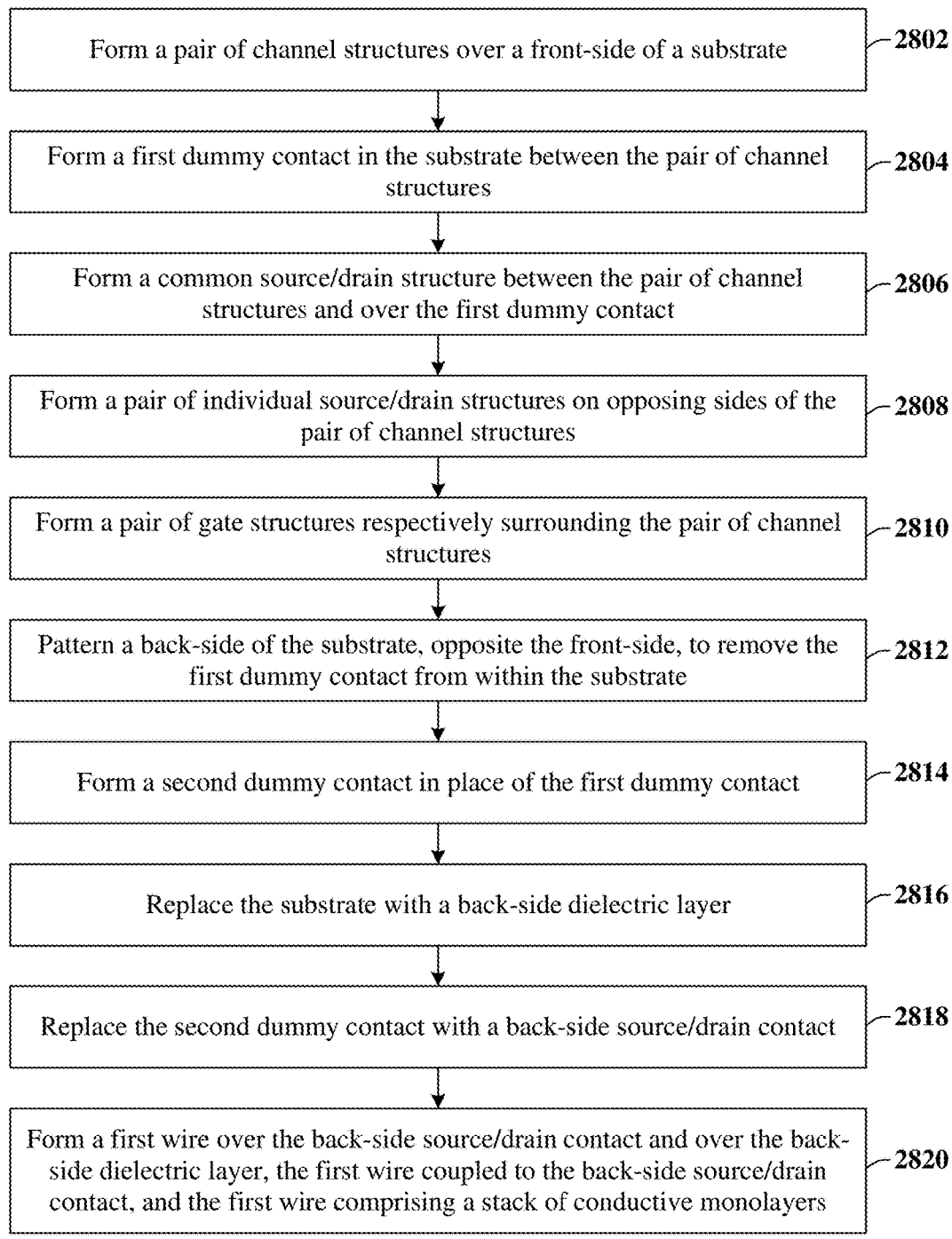
FIG. 28 illustrates a flow diagram of some embodiments of a method for forming an integrated chip comprising a back-side source/drain contact and further comprising a first wire that comprises a stack of conductive monolayers.

FIG. 28 illustrates a flow diagram of some embodiments of a method 2800 for forming an integrated chip comprising a back-side source/drain contact and further comprising a first wire that comprises a stack of conductive monolayers. While method 2800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2802, a pair of channel structures are formed over a front-side of a substrate. FIG. 9 illustrates a cross-sectional view 900 of some embodiments corresponding to act 2802.

At 2804, a first dummy contact is formed in the substrate between the pair of channel structures. FIG. 11 illustrates a cross-sectional view 1100 of some embodiments corresponding to act 2804.

At 2806, a common source/drain structure is formed between the pair of channel structures and over the first dummy contact. FIG. 12 illustrates a cross-sectional view 1200 of some embodiments corresponding to act 2806.

At 2808, a pair of individual source/drain structures are formed on opposing sides of the pair of channel structures. FIG. 12 illustrates a cross-sectional view 1200 of some embodiments corresponding to act 2808.

At 2810, a pair of gate structures are formed respectively surrounding the pair of channel structures. FIG. 15 illustrates a cross-sectional view 1500 of some embodiments corresponding to act 2810.

At 2812, a back-side of the substrate, opposite the front-side, is patterned to remove the first dummy contact from within the substrate. FIG. 20 illustrates a cross-sectional view 2000 of some embodiments corresponding to act 2812.

At 2814, a second dummy contact is formed in place of the first dummy contact. FIG. 21 illustrates a cross-sectional view 2100 of some embodiments corresponding to act 2814.

At 2816, the substrate is replaced with a back-side dielectric layer. FIG. 23 illustrates a cross-sectional view 2300 of some embodiments corresponding to act 2816.

At 2818, the second dummy contact is replaced with a back-side source/drain contact. FIG. 25 illustrates a cross-sectional view 2500 of some embodiments corresponding to act 2818.

At 2820, a first wire is formed over the back-side source/drain contact and over the back-side dielectric layer, the first wire coupled to the back-side source/drain contact, and the first wire comprising a stack of conductive monolayers. FIG. 26 illustrates a cross-sectional view 2600 of some embodiments corresponding to act 2820.

Thus, the present disclosure relates to an integrated chip including a source/drain contact on a back-side of a semiconductor device and including a first wire that is on the source/drain contact and that comprises a first stack of conductive monolayers for improving a performance of the integrated chip.

Accordingly, in some embodiments, the present disclosure relates to an integrated chip comprising a semiconductor device. The semiconductor device comprises a first source/drain structure, a second source/drain structure, a stack of channel structures, and a gate structure. The stack of channel structures and the gate structure are between and border the first and second source/drain structures. The gate structure extends in a closed path to surround the stack of channel structures. A first conductive wire overlies and is spaced from the semiconductor device. The first conductive wire comprises a first stack of conductive layers. A first conductive contact extends through a dielectric layer from the first conductive wire to the first source/drain structure. A bottom surface of the first source/drain structure, opposite a top surface of the first source/drain structure, and a bottom surface of the gate structure face away from the first conductive wire. The bottom surface of the gate structure is below the bottom surface of the first source/drain structure. The first conductive contact is on the top surface of the first source/drain structure.

In other embodiments, the present disclosure relates to an integrated chip comprising a first gate structure between and bordering a first source/drain structure and a second source/drain structure. A first channel structure is within the first gate structure and extends laterally from the first source/drain structure to the second source/drain structure. A first wire is on a front-side of the first source/drain structure and is directly contacting the first gate structure. A metal source/drain contact is on a back-side of the first source/drain structure and is electrically coupled to the first source/drain structure. The metal source/drain contact extends through a dielectric layer to a top surface of the first source/drain structure. A second wire on the metal source/drain contact. The second wire comprises a first stack of two-dimensional materials. The metal source/drain contact is in direct contact with the first stack of two-dimensional materials.

In yet other embodiments, the present disclosure relates to a method for forming an integrated chip. The method comprises forming a pair of stacks of channel structures over a substrate. A first dummy contact is formed in the substrate between the stacks of channel structures. A common source/drain structure is formed between the stacks of channel structures and over the first dummy contact. A pair of individual source/drain structures are formed on opposing sides of the stacks of channel structures. A pair of gate structures are formed respectively surrounding the pair of stacks of channel structures. A back-side of the substrate is patterned to remove the first dummy contact from within the substrate. A metal source/drain contact is formed in place of the first dummy contact. The substrate is replaced with a dielectric layer. A first wire is formed over the metal source/drain contact and is electrically coupled to the metal source/drain contact. Forming the first wire comprises depositing a first stack of conductive monolayers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    forming a pair of stacks of channel structures over a substrate;
    forming a first dummy contact in the substrate between the stacks of channel structures;

forming a common source/drain structure between the stacks of channel structures and over the first dummy contact;
forming a pair of individual source/drain structures on opposing sides of the stacks of channel structures;
forming a pair of gate structures respectively surrounding the pair of stacks of channel structures;
patterning a back-side of the substrate to remove the first dummy contact from within the substrate;
forming a metal source/drain contact in place of the first dummy contact;
replacing the substrate with a dielectric layer; and
forming a first wire over the metal source/drain contact and electrically coupled to the metal source/drain contact, wherein forming the first wire comprises depositing a first stack of conductive monolayers.

2. The method of claim 1, wherein forming the metal source/drain contact in place of the first dummy contact comprises forming a second dummy contact in place of the first dummy contact, removing the second dummy contact, and forming the metal source/drain contact in place of the second dummy contact.

3. The method of claim 1, wherein forming the first wire further comprises depositing one or more metal layers.

4. The method of claim 1, further comprising:
forming a wire on the pair of gate structures and electrically coupled to the gate structures, wherein forming the wire comprises depositing a second stack of conductive monolayers.

5. The method of claim 1, wherein replacing the substrate with the dielectric layer comprises:
etching the substrate to remove the substrate from over the pair of stacks of channel structures; and
forming the dielectric layer in place of the substrate.

6. The method of claim 1, wherein the first stack of conductive monolayers is deposited directly on the metal source/drain contact.

7. The method of claim 1, further comprising:
forming an interfacial layer around the pair of stacks of channel structures before forming the pair of gate structures; and
forming a gate dielectric layer around the interfacial layer, wherein the pair of gate structures are formed around the gate dielectric layer.

8. The method of claim 1, wherein forming the first dummy contact in the substrate between the stacks of channel structures comprises:
etching a front-side of the substrate, opposite the back-side, to form a first dummy contact opening in the substrate between the stacks of channel structures; and
depositing the first dummy contact in the first dummy contact opening.

9. A method for forming an integrated chip, the method comprising:
forming a stack of channel layers over a front-side of a substrate;
etching the front-side of the substrate to form a dummy contact opening in the substrate laterally beside the stack of channel layers;
forming a first dummy contact in the dummy contact opening;
forming a first source/drain layer and a second source/drain layer laterally beside the stack of channel layers on opposite sides of the stack of channel layers, the first source/drain layer directly overlying the first dummy contact, the second source/drain layer directly overlying the substrate;
forming a gate structure surrounding the stack of channel layers;
etching the first dummy contact from a back-side of the substrate to remove the first dummy contact from within the substrate;
forming a metal source/drain contact in place of the first dummy contact and directly over the first source/drain layer; and
depositing a first stack of conductive monolayers over the metal source/drain contact to form a first wire over the metal source/drain contact, wherein the first stack of conductive monolayers are electrically coupled to the metal source/drain contact.

10. The method of claim 9, wherein etching the first dummy contact from the back-side of the substrate uncovers a back-side of the first source/drain layer.

11. The method of claim 9, further comprising:
depositing a second stack of conductive monolayers over the gate structure to form a second wire over the gate structure, wherein the second stack of conductive monolayers are coupled to the gate structure.

12. The method of claim 9, further comprising:
forming a dummy gate over the stack of channel layers; and
removing the dummy gate from over the stack of channel layers before forming the gate structure, wherein the gate structure is formed in place of the dummy gate.

13. The method of claim 9, further comprising:
depositing a metal on the first stack of conductive monolayers to further form the first wire.

14. The method of claim 9, wherein the first stack of conductive monolayers comprises a first graphene stack.

15. The method of claim 9, wherein the first stack of conductive monolayers is formed directly on the metal source/drain contact.

16. A method for forming an integrated chip, the method comprising:
forming a pair of stacks of channel layers over a front-side of a substrate;
forming a pair of dummy gate layers respectively over the pair of stacks of channel layers;
etching the front-side of the substrate between the pair of stacks of channel layers to form a first dummy contact opening in the substrate between the pair of stacks of channel layers;
forming a first dummy contact in the first dummy contact opening, the first dummy contact disposed along the front-side of the substrate and between the pair of stacks of channel layers;
forming a common source/drain layer directly between the pair of stacks of channel layers and directly over the first dummy contact;
forming a pair of individual source/drain layers on opposing sides of the pair of stacks of channel layers and laterally spaced apart from the common source/drain layer;
removing the pair of dummy gate layers from over the substrate;
forming a pair of gate layers in place of the pair of dummy gate layers, the pair of gate layers respectively surrounding the pair of stacks of channel layers;
forming a front-side interconnect structure over the front-side of the substrate and coupled to the pair of gate layers;
etching the first dummy contact from a back-side of the substrate, opposite the front-side, to remove the first dummy contact from within the substrate, thereby leaving a second dummy contact opening in the substrate in place of the first dummy contact;

forming a second dummy contact in the second dummy contact opening;

removing the substrate from around the second dummy contact;

forming a dielectric layer around the second dummy contact in place of the substrate;

etching the second dummy contact to remove the second dummy contact from within the dielectric layer, thereby leaving a metal contact opening in the dielectric layer in place of the second dummy contact;

forming a metal source/drain contact in the metal contact opening; and forming a back-side interconnect structure over the metal source/drain contact, the back-side interconnect structure comprising a stack of conductive monolayers on the metal source/drain contact and electrically coupled to the metal source/drain contact.

17. The method of claim 16, wherein forming the pair of stacks of channel layers comprises:

depositing an alternating stack of channel layers and sacrificial semiconductor layers; and etching the alternating stack of channel layers and sacrificial semiconductor layers to delimit the pair of stacks of channel layers.

18. The method of claim 16, wherein the first dummy contact comprises a semiconductor and the second dummy contact comprises a dielectric.

19. The method of claim 16, wherein the front-side interconnect structure comprises a front-side stack of conductive monolayers on the pair of gate layers and electrically coupled to the pair of gate layers.

20. The method of claim 16, further comprising:

depositing a dielectric liner layer in the metal contact opening along sidewalls of the dielectric layer before forming the metal source/drain contact in the metal contact opening.

* * * * *